(12) United States Patent
Krupyshev et al.

(10) Patent No.: US 8,008,884 B2
(45) Date of Patent: Aug. 30, 2011

(54) SUBSTRATE PROCESSING APPARATUS WITH MOTORS INTEGRAL TO CHAMBER WALLS

(75) Inventors: Alexander G. Krupyshev, Chelmsford, MA (US); Christopher Hofmeister, Hampstead, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 326 days.

(21) Appl. No.: 12/175,278

(22) Filed: Jul. 17, 2008

(65) Prior Publication Data
US 2009/0022571 A1  Jan. 22, 2009

Related U.S. Application Data

(60) Provisional application No. 60/950,331, filed on Jul. 17, 2007.

(51) Int. Cl.
*B25J 15/02* (2006.01)
(52) U.S. Cl. ............... 318/568.21; 318/560; 318/561; 451/66
(58) Field of Classification Search ............ 318/568.21, 318/560, 561, 562, 571, 572, 570.571; 451/332, 451/166, 66; 414/744.5; 74/490.03; 73/865.9; 156/345.12
See application file for complete search history.

(56) References Cited

U.S. PATENT DOCUMENTS

| | | | |
|---|---|---|---|
| 3,750,151 A | 7/1973 | Dill | 340/379 |
| 4,144,110 A | 3/1979 | Luc | 156/73.5 |
| 4,360,753 A | 11/1982 | Shannon | 310/93 |
| 4,609,332 A | 9/1986 | Miki et al. | 417/352 |
| 4,689,945 A | 9/1987 | Lattion et al. | 57/263 |
| 4,874,998 A | 10/1989 | Hollis, Jr. | 318/568.21 |
| 4,956,945 A | 9/1990 | Ooshima | 51/165.93 |
| 5,092,453 A | 3/1992 | Bruke | 198/673 |
| 5,126,610 A | 6/1992 | Fremerey | 310/90.5 |
| 5,324,155 A | 6/1994 | Goodwin et al. | 414/225 |
| 5,530,306 A | 6/1996 | Ueyama | 310/90.5 |
| 5,550,413 A | 8/1996 | Bernus et al. | 310/36 |
| 5,555,715 A | 9/1996 | Paweletz et al. | 57/414 |
| 5,625,240 A | 4/1997 | Bernus | 310/90.5 |
| 5,642,298 A | 6/1997 | Mallory et al. | 364/561 |
| 5,741,113 A * | 4/1998 | Bacchi et al. | 414/744.5 |
| 5,801,721 A | 9/1998 | Gandy et al. | 347/3 |
| 5,818,137 A | 10/1998 | Nichols et al. | 310/90.5 |
| 5,838,121 A | 11/1998 | Fairbairn et al. | 318/45 |
| 5,899,658 A * | 5/1999 | Hofmeister | 414/744.5 |
| 5,914,548 A | 6/1999 | Watanabe et al. | 310/88 |
| 5,961,291 A | 10/1999 | Sakagami et al. | 417/42 |
| 6,015,272 A | 1/2000 | Antaki et al. | 417/356 |

(Continued)

FOREIGN PATENT DOCUMENTS

EP  129731  1/1985

(Continued)

*Primary Examiner* — Paul Ip
(74) *Attorney, Agent, or Firm* — Perman & Green, LLP; Richard Pickreign

(57) ABSTRACT

A substrate transport apparatus including a peripheral wall having an inner surface that defines a substrate transport chamber capable of holding an isolated atmosphere, at least one substantially ring shaped motor having at least one stator module located within the peripheral wall, between the inner surface and an adjacent outer surface of the peripheral wall and at least one rotor suspended substantially without contact within the transport chamber such that a surface of the peripheral wall encompassed by the ring shaped motor is configured for attachment thereto of a predetermined device and at least one substrate transport arm connected to the at least one rotor and having at least one end effector configured to hold at least one substrate.

31 Claims, 29 Drawing Sheets

U.S. PATENT DOCUMENTS

| | | | | |
|---|---|---|---|---|
| 6,049,148 | A | 4/2000 | Nichols et al. | 310/68 |
| 6,086,362 | A | 7/2000 | White et al. | 432/243 |
| 6,096,231 | A | 8/2000 | Schertler | 216/41 |
| 6,100,618 | A | 8/2000 | Schoeb et al. | 310/90.5 |
| 6,175,174 | B1 | 1/2001 | Takahashi | 310/90.5 |
| 6,176,668 | B1 | 1/2001 | Kurita et al. | 414/217 |
| 6,189,404 | B1* | 2/2001 | Hatake et al. | 74/490.03 |
| 6,206,176 | B1 | 3/2001 | Blonigan et al. | 198/619 |
| 6,227,817 | B1 | 5/2001 | Paden | 417/356 |
| 6,235,172 | B1 | 5/2001 | Begin et al. | 204/298.27 |
| 6,244,835 | B1 | 6/2001 | Antaki et al. | 417/356 |
| 6,269,552 | B1 | 8/2001 | Honda et al. | 34/317 |
| 6,299,404 | B1 | 10/2001 | Muka et al. | 414/744.5 |
| 6,324,134 | B1 | 11/2001 | Ohtachi et al. | 369/44.32 |
| 6,384,500 | B1 | 5/2002 | Chassoulier et al. | 310/90.5 |
| 6,416,215 | B1 | 7/2002 | Terentiev | 366/273 |
| 6,447,265 | B1 | 9/2002 | Antaki et al. | 417/354 |
| 6,447,266 | B2 | 9/2002 | Antaki et al. | 417/356 |
| 6,471,459 | B2 | 10/2002 | Blonigan et al. | 414/217 |
| 6,485,531 | B1 | 11/2002 | Schob | 29/25.01 |
| 6,537,011 | B1 | 3/2003 | Wang et al. | 414/217 |
| 6,573,088 | B2 | 6/2003 | Gemmell et al. | 435/286.4 |
| 6,629,883 | B2* | 10/2003 | Katsuoka et al. | 451/332 |
| 6,809,450 | B1 | 10/2004 | Morrison | 310/90.5 |
| 6,813,543 | B2 | 11/2004 | Aalund et al. | 700/245 |
| 6,864,955 | B2 | 3/2005 | Nishi et al. | 355/53 |
| 6,877,963 | B2 | 4/2005 | Beyer et al. | 417/365 |
| 6,878,044 | B2* | 4/2005 | Sakurai et al. | 451/67 |
| 6,879,126 | B2 | 4/2005 | Paden et al. | 318/610 |
| 6,916,231 | B2* | 7/2005 | Wakabayashi | 451/66 |
| 6,991,710 | B2 | 1/2006 | Harris et al. | 204/198 |
| 7,023,118 | B1 | 4/2006 | Morrison | 310/90.5 |
| 7,030,528 | B2 | 4/2006 | Morgante | 310/112 |
| 7,053,582 | B2 | 5/2006 | Ueyama et al. | 318/632 |
| 7,070,398 | B2 | 7/2006 | Olsen et al. | 417/353 |
| 7,087,143 | B1 | 8/2006 | Schmidt et al. | 204/224 R |
| RE39,748 | E | 7/2007 | Watanabe et al. | 310/88 |
| 7,246,985 | B2* | 7/2007 | Ferrara | 414/217 |
| 7,371,306 | B2 | 5/2008 | Davis et al. | 156/345.22 |
| 2001/0044266 | A1* | 11/2001 | Katsuoka et al. | 451/66 |
| 2002/0070617 | A1 | 6/2002 | Kanebako | 310/90.5 |
| 2003/0102748 | A1 | 6/2003 | Yashiro et al. | 310/90.5 |
| 2004/0072499 | A1* | 4/2004 | Wakabayashi | 451/5 |
| 2004/0261550 | A1* | 12/2004 | Asa | 73/865.9 |
| 2004/0261944 | A1* | 12/2004 | Wakabayashi et al. | 156/345.12 |
| 2005/0002743 | A1 | 1/2005 | Moriya et al. | 406/198 |
| 2005/0089422 | A1 | 4/2005 | Ozaki et al. | 417/423.12 |
| 2005/0135942 | A1 | 6/2005 | Wood et al. | 417/348 |
| 2005/0136694 | A1 | 6/2005 | Inoue et al. | 438/795 |
| 2005/0188798 | A1 | 9/2005 | Bischof et al. | 84/1.11 |
| 2005/0265814 | A1 | 12/2005 | Coady | 414/744.5 |
| 2006/0017340 | A1 | 1/2006 | Kozaki et al. | 310/90.5 |
| 2006/0219275 | A1 | 10/2006 | Weber et al. | 134/64 R |
| 2006/0275155 | A1 | 12/2006 | Thibodeau | 417/410.1 |
| 2006/0279149 | A1 | 12/2006 | Asper | 310/90.5 |
| 2007/0024138 | A1 | 2/2007 | Buhler et al. | 310/90.5 |
| 2007/0065144 | A1 | 3/2007 | Hofmeister et al. | 396/611 |
| 2007/0269986 | A1 | 11/2007 | Kalenian et al. | 438/692 |
| 2008/0011334 | A1 | 1/2008 | Rye et al. | 134/95.1 |
| 2008/0121064 | A1 | 5/2008 | Todorov | 74/490.04 |

FOREIGN PATENT DOCUMENTS

| | | |
|---|---|---|
| EP | 414127 | 2/1991 |
| EP | 526903 | 2/1993 |
| EP | 641061 | 3/1995 |
| EP | 758157 | 2/1997 |
| EP | 816701 | 1/1998 |
| EP | 1114648 | 7/2001 |
| EP | 1732011 | 12/2006 |
| GB | 1552874 | 9/1979 |
| GB | 2035622 | 6/1980 |
| JP | 61152304 | 7/1986 |
| JP | 1023468 | 1/1989 |
| JP | 1240268 | 9/1989 |
| JP | 3276317 | 12/1991 |
| JP | 4209996 | 7/1992 |
| JP | 4308823 | 10/1992 |
| JP | 6213233 | 8/1994 |
| JP | 7012091 | 1/1995 |
| JP | 8323505 | 12/1996 |
| JP | 10023781 | 1/1998 |
| WO | 8912907 | 12/1989 |
| WO | 9837335 | 8/1998 |
| WO | 0102721 | 1/2001 |
| WO | 0231372 | 4/2002 |
| WO | 2004098677 | 11/2004 |
| WO | 2005003565 | 1/2005 |
| WO | 2005030296 | 4/2005 |
| WO | 2006010285 | 2/2006 |
| WO | 2006053384 | 5/2006 |
| WO | 2008003943 | 4/2008 |

* cited by examiner

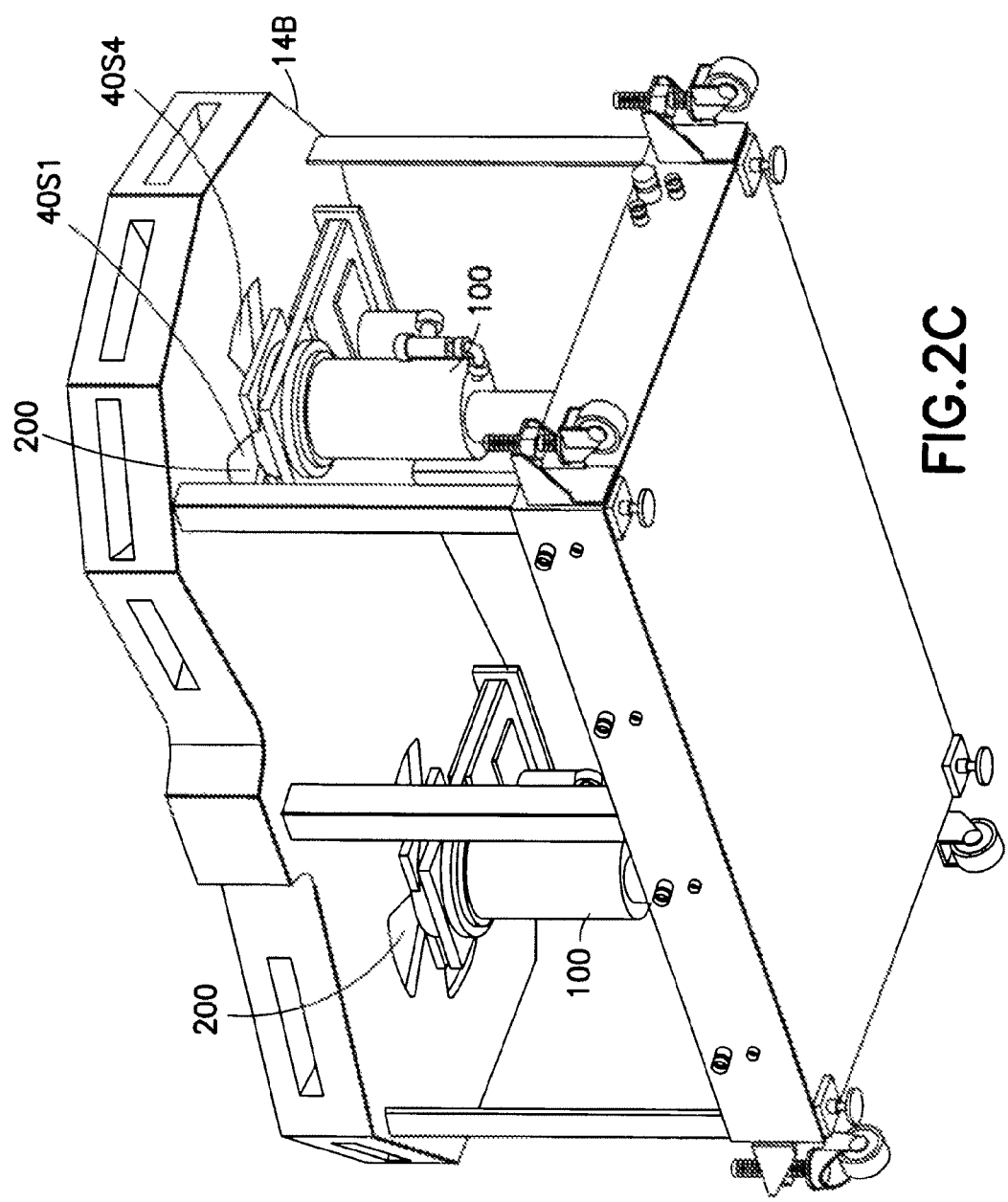

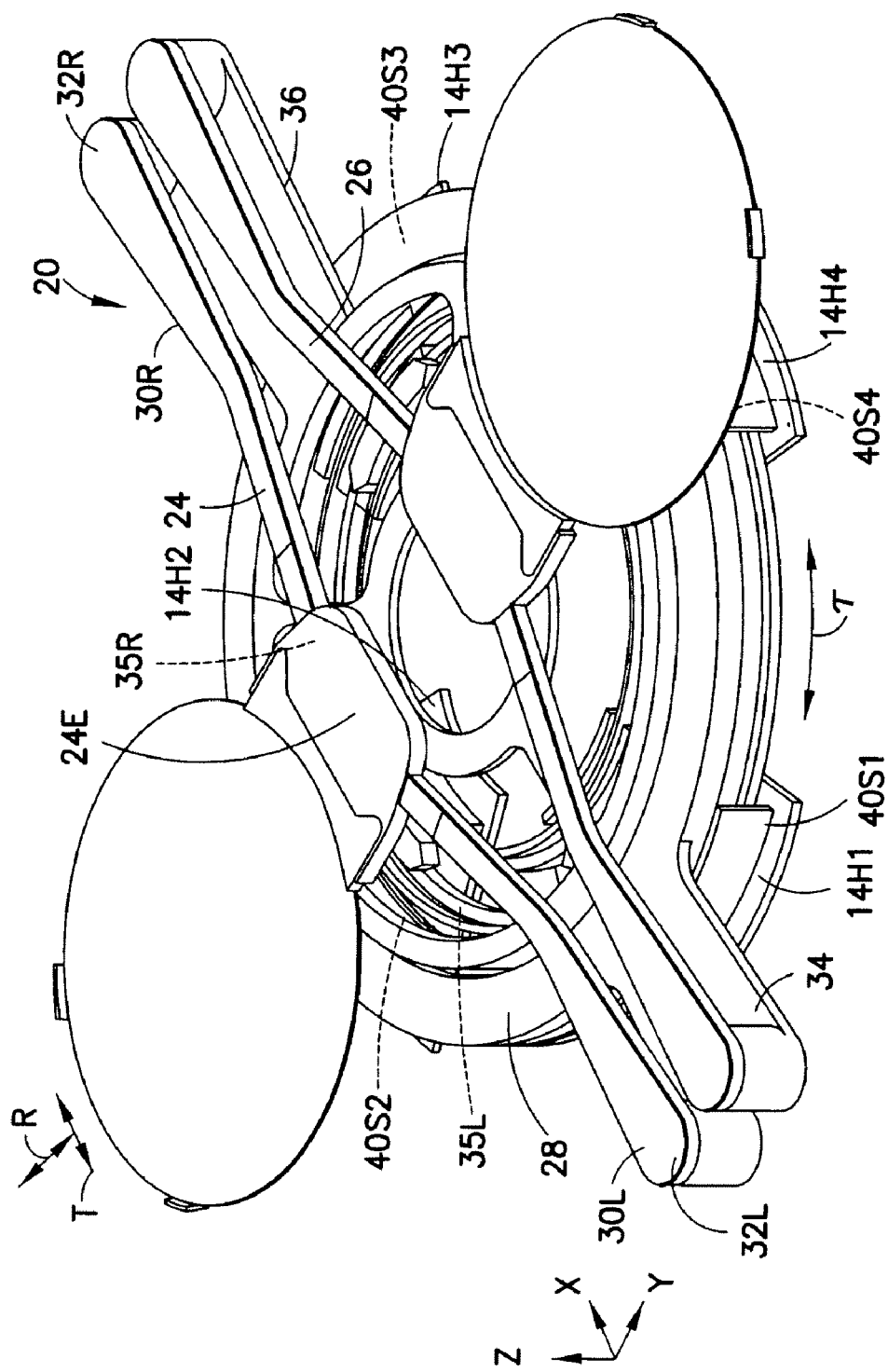

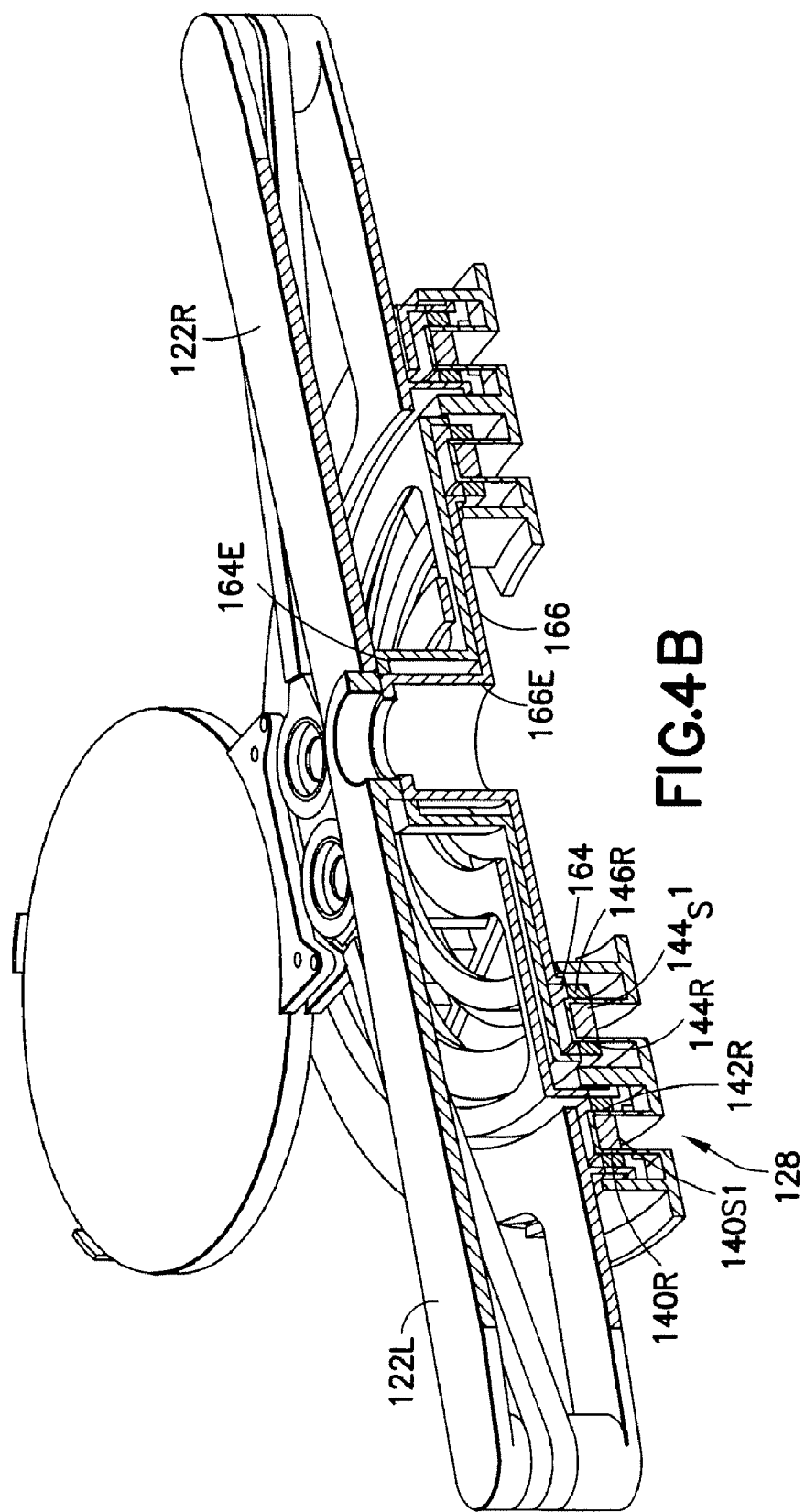

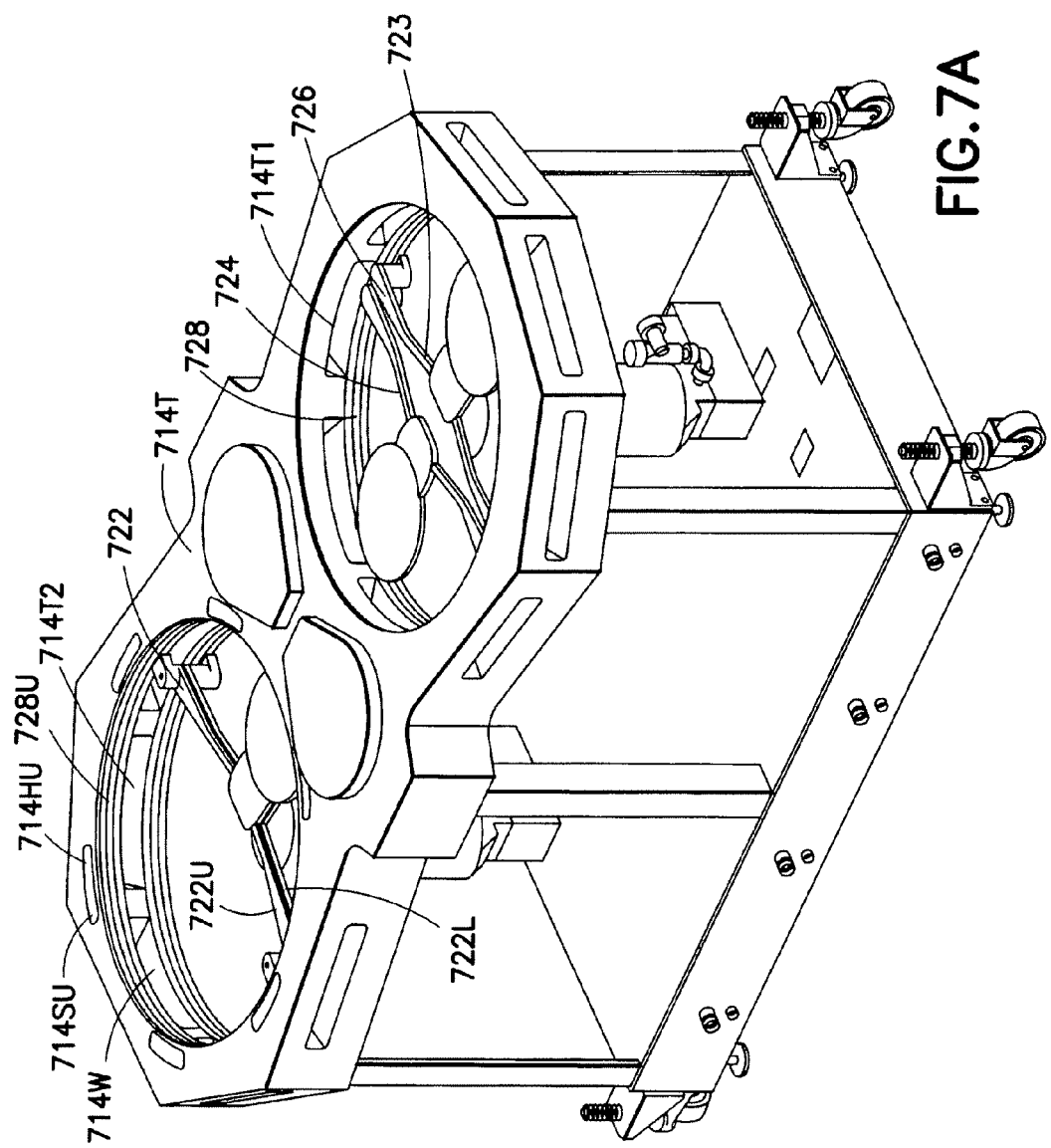

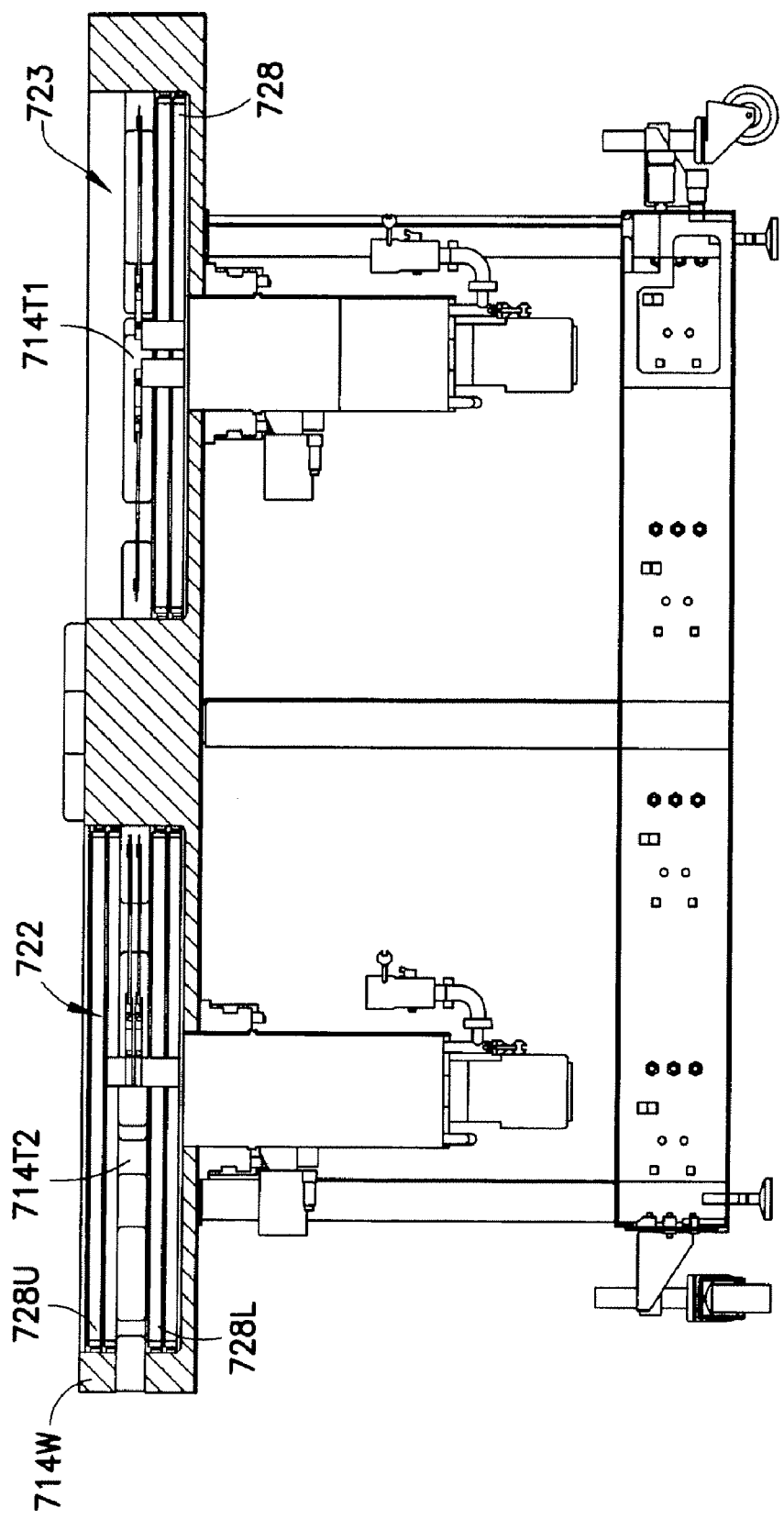

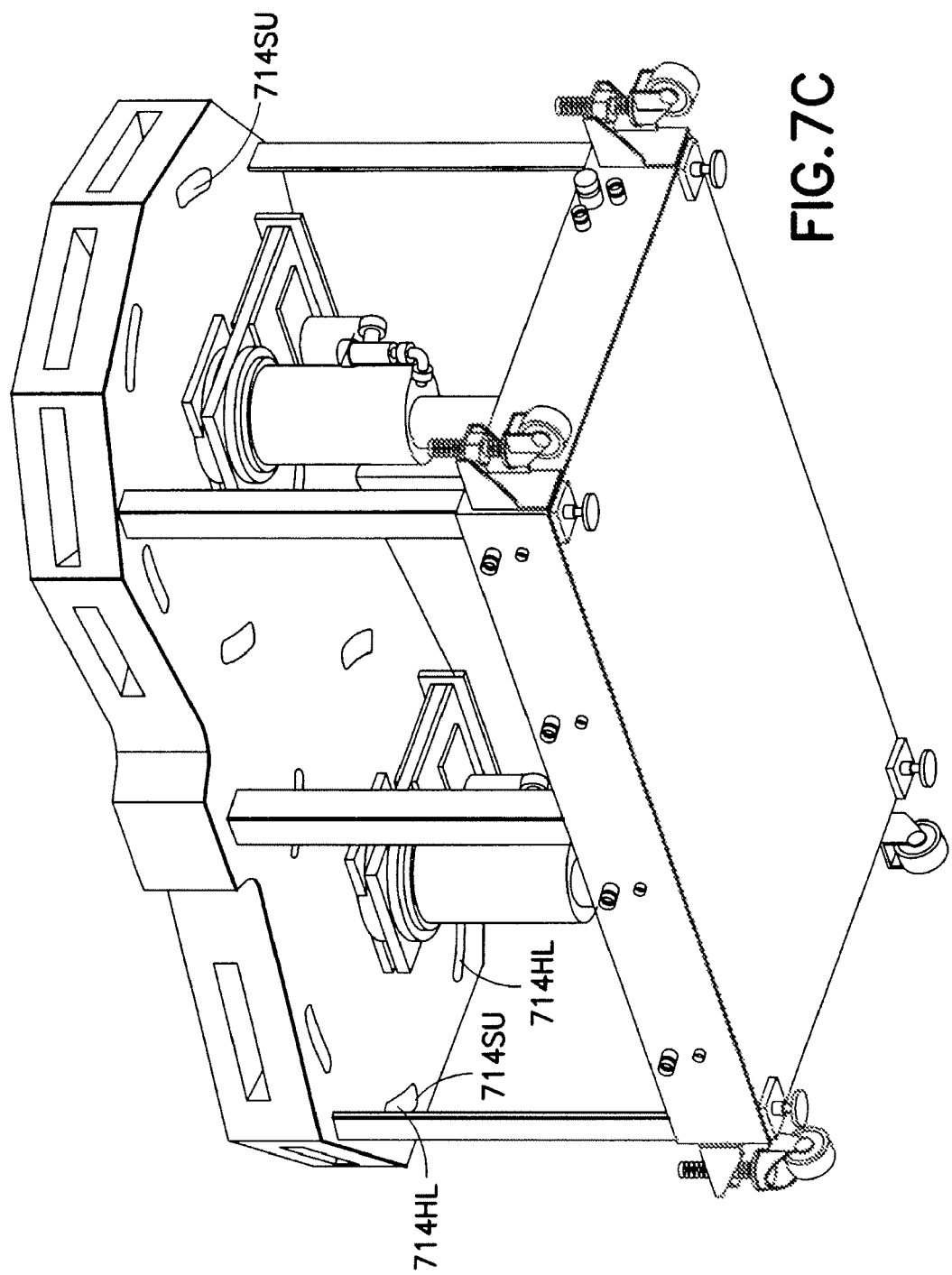

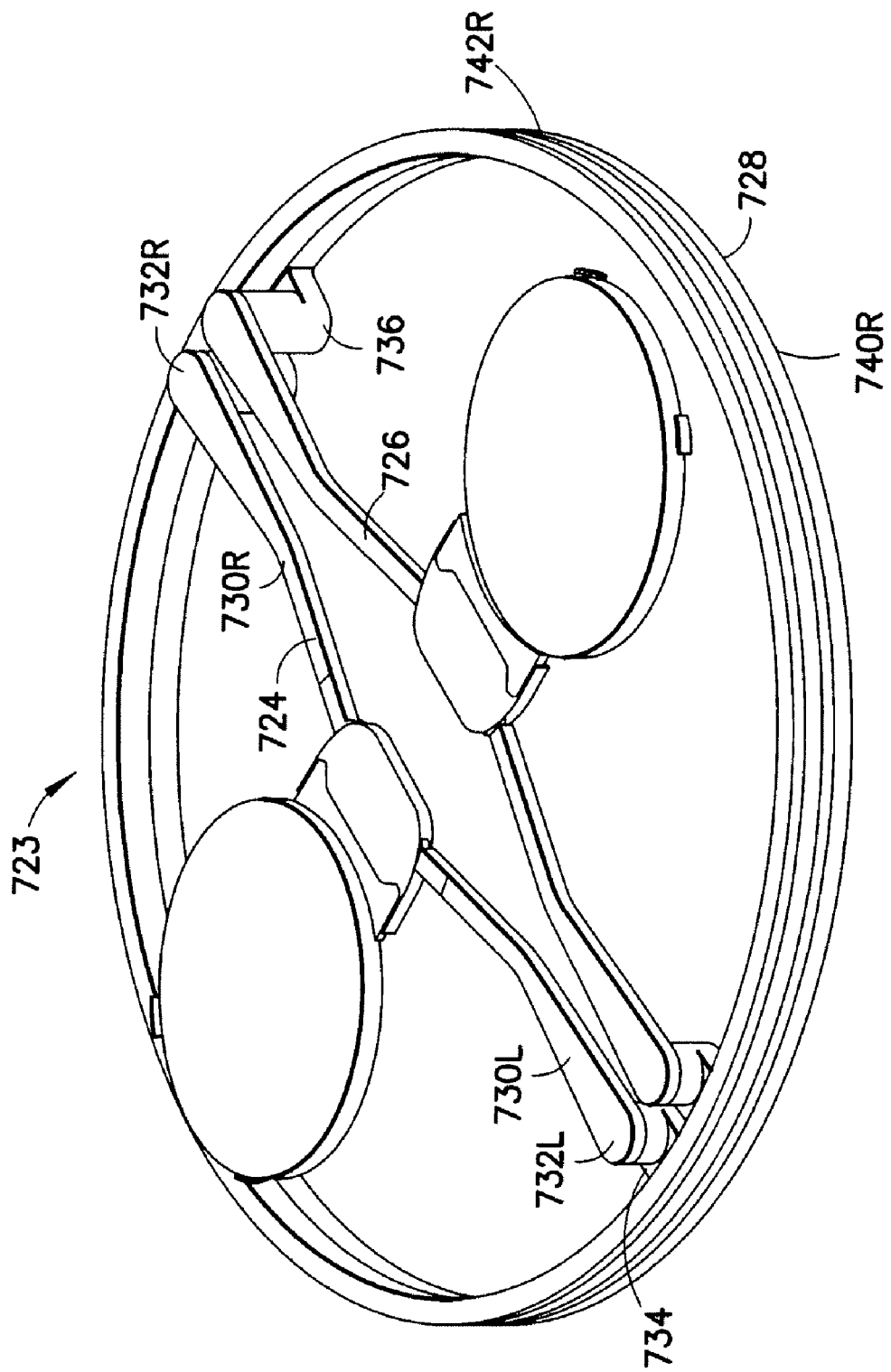

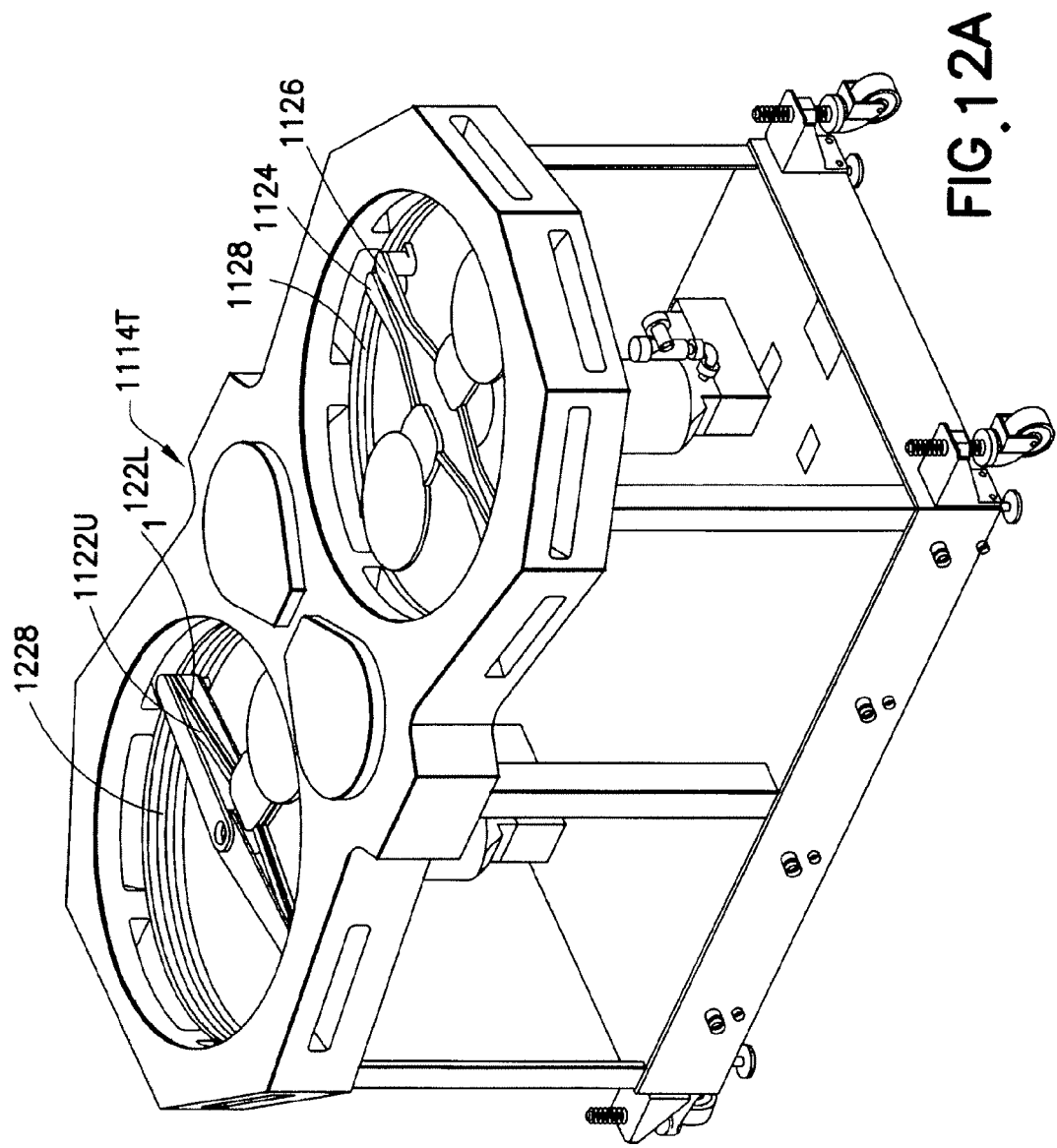

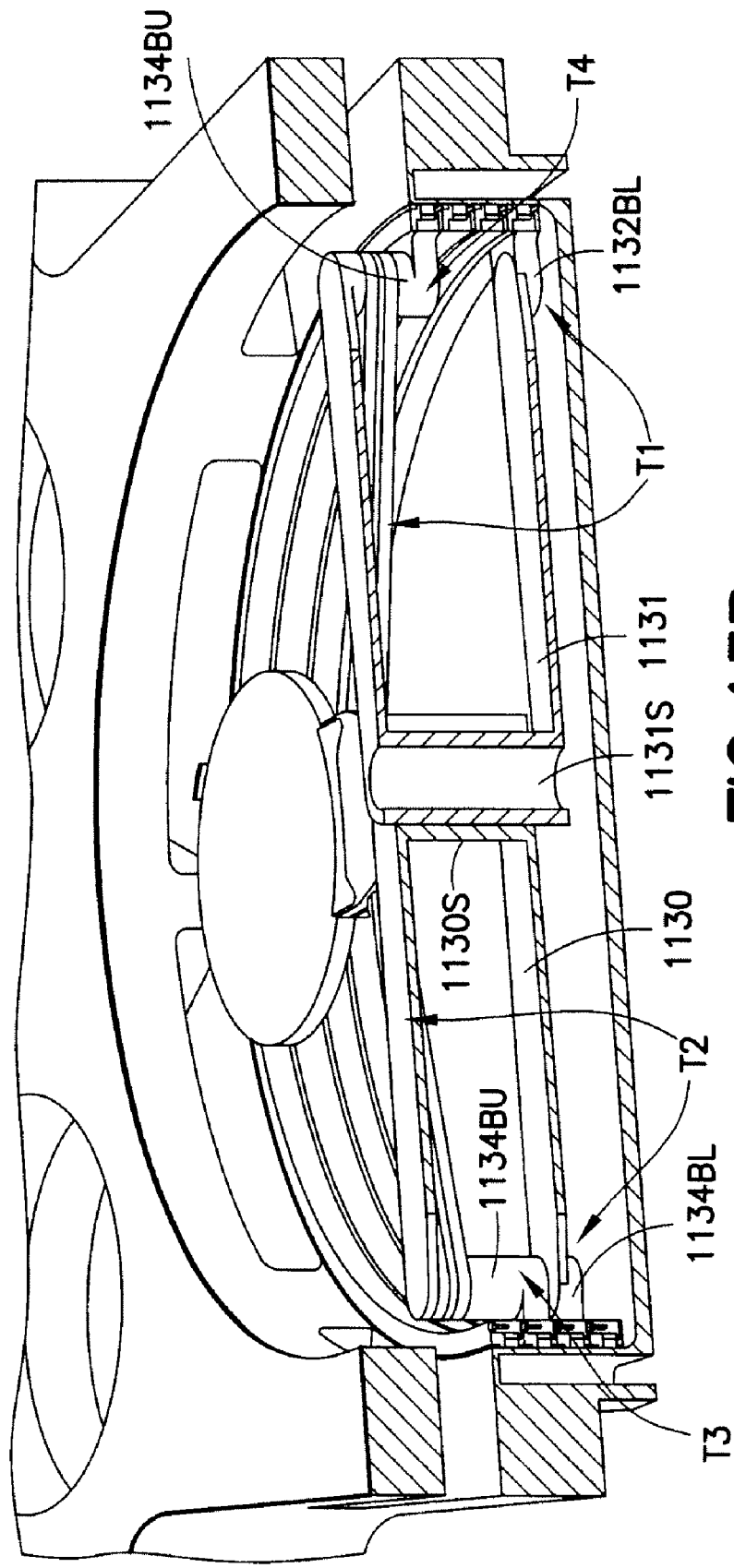

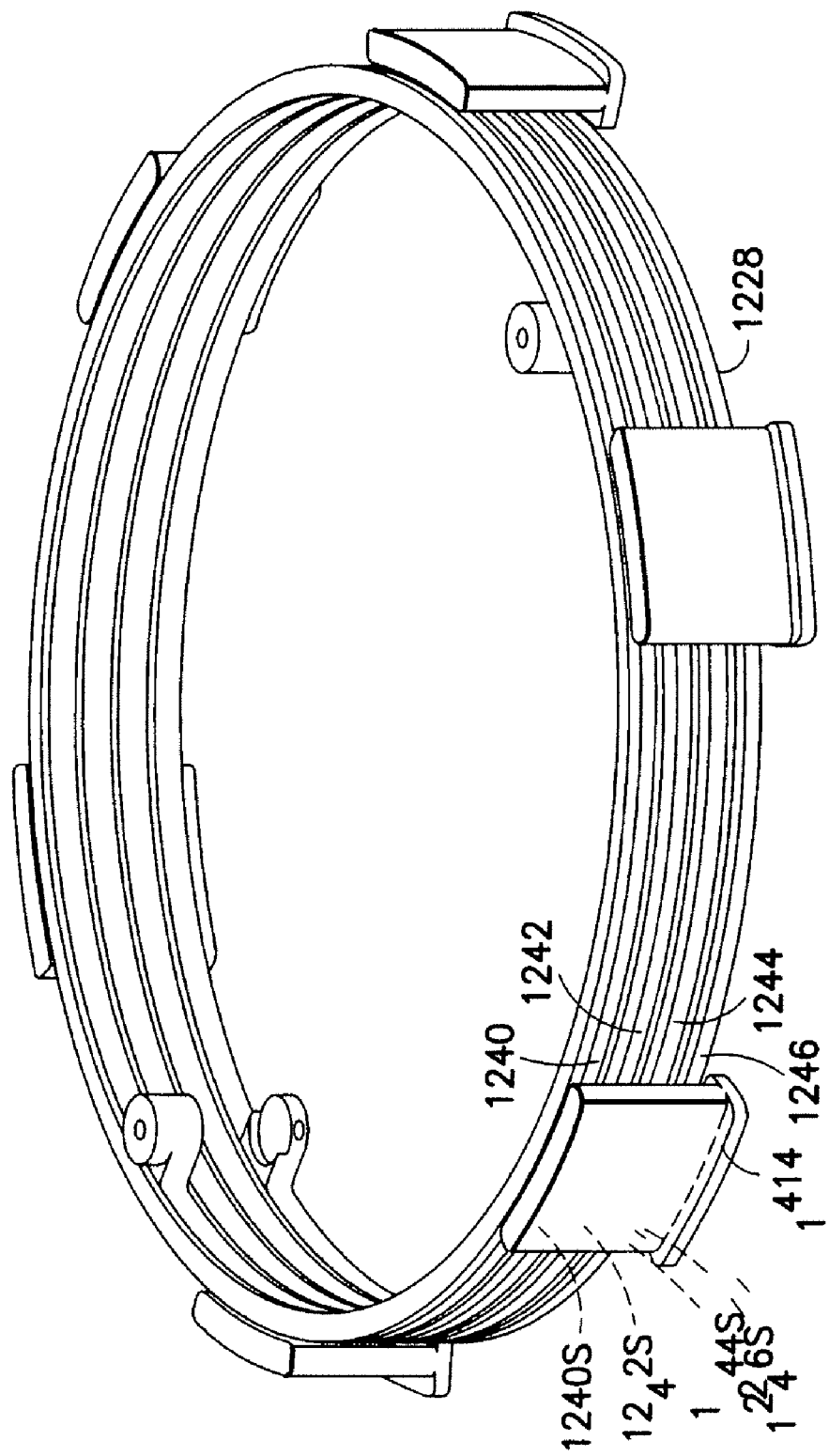

SUBSTRATE PROCESSING APPARATUS WITH MOTORS INTEGRAL TO CHAMBER WALLS

CROSS-REFERENCE TO RELATED APPLICATION(S)

This application claims the benefit of U.S. Provisional Patent Application No. 60/938,913, filed on May 18, 2007, the disclosure of which is incorporated by reference herein in its entirety.

BACKGROUND

1. Field

The exemplary embodiments generally relate to substrate transfer systems and, more particularly, to substrate transfer robots.

2. Brief Description of Related Developments

Conventional substrate processing apparatus may include one or more sections having chambers with an isolated atmosphere (e.g. vacuum or inert gas). Conventional process apparatus may also include a substrate transport system disposed within the isolated atmosphere chambers to transport substrates between the various stations of the processing apparatus. The conventional transport system may include one or more arms and the drive section with motors powering the arms. The motors or parts thereof may be located in the isolated atmosphere, and the conventional drive section may have conventional bearings supporting shafts that power the arms. The conventional bearings may pose a concern for introducing undesired contamination into the isolated atmosphere such as from bearing contact and from the use of lubricants that may off gas for example at vacuum. In addition, conventional drive sections may be located exterior to the walls of the isolated atmosphere or vacuum chambers, with the isolated portion of the drive section in communication with the chambers to effect connection to the arms inside the chambers. Hence, in conventional apparatus the drive section may contribute an additional volume to the isolated atmosphere or vacuum chamber, and corresponding resultant increase in the time for pumping the isolated atmosphere or vacuum in the chamber. Also, the arm sections of conventional transport system may be centrally positioned, in order to effect transport throughout the processing apparatus. Thus, the drive section in conventional systems may be centrally positioned under the bottom of the isolated atmosphere or vacuum chambers thereby restricting or limiting access for connections of other systems to the bottom of the isolated atmosphere chambers. The exemplary embodiments disclosed herein overcome the problems of conventional system as will be described in greater detail below.

SUMMARY

In one exemplary embodiment, a substrate transport apparatus is provided. The substrate transport apparatus includes a peripheral wall having an inner surface that defines a substrate transport chamber capable of holding an isolated atmosphere, at least one substantially ring shaped motor having at least one stator module located within the peripheral wall, between the inner surface and an adjacent outer surface of the peripheral wall and at least one rotor suspended substantially without contact within the transport chamber such that a surface of the peripheral wall encompassed by the ring shaped motor is configured for attachment thereto of a predetermined device and at least one substrate transport arm connected to the at least one rotor and having at least one end effector configured to hold at least one substrate.

In another exemplary embodiment, a substrate transport apparatus is provided. The substrate transport apparatus includes a frame forming a chamber, a plurality of stator module sets embedded at least partly into a peripheral wall of the chamber, each stator module set forming a part of a respective motor where each of the plurality of stator module sets is radially spaced apart from other different stator module sets in the plurality of stator module sets, a plurality of rotors, each rotor being supported by a respective one of the stator module sets substantially without contact and at least one end effector connected to a respective one of the plurality of rotors, each of the at least one end effector being configured to support a substrate, wherein each of the stator module sets and a respective rotor are configured to effect an extension and retraction of a respective one of the at least one end effector.

In still another exemplary embodiment, a substrate processing apparatus is provided. The substrate processing apparatus includes a frame having at least one isolatable chamber capable of holding a predetermined atmosphere, a substrate transport located at least partly within the at least one isolatable chamber, the substrate transport being configured to transport at least one substrate, the substrate transport comprising, at least two nested stator modules removably embedded into a peripheral wall of the at least one isolatable chamber, at least two rotors located within the at least one isolatable chamber, each of the at leas two rotors being supported by a respective one of the at least one stator substantially without contact forming at least two nested motors such that one of the at least two nested motors is surrounded by another different other one of the at least two nested motors, and at least one transport arm coupled to the at least two rotors, the at least one transport arm having at least one end effector for supporting substrates, wherein the at least two nested motors provide at least a two degree of freedom motion to the at least one transport arm.

In yet another exemplary embodiment a substrate transport apparatus includes a frame forming a substrate transport chamber, at least one motor comprising a set of stator modules circumferentially distributed onto a peripheral wall of the substrate transport chamber, each of the stator modules being independently mountable to the peripheral wall, the at least one motor further comprising at least one common ring rotor operating with each of the stator module and at least one end effector connected to the at least one common ring rotor, each of the at least one end effector being configured to support a substrate, wherein the set of stator modules and the at least one common ring rotor being configured to effect a motor motion of the at least one end effector in at least one degree of freedom.

BRIEF DESCRIPTION OF THE DRAWINGS

The foregoing aspects and other features of the disclosed embodiments are explained in the following description, taken in connection with the accompanying drawings, wherein:

FIGS. 2A-2C respectively illustrate a schematic top perspective view, a side cross-sectional view and a schematic bottom perspective view of a transport chamber section in accordance with an exemplary embodiment;

FIGS. 3A-3C respectively show a schematic perspective view, a schematic partial perspective view and a side cross-sectional view of a transport apparatus in accordance with an exemplary embodiment;

FIGS. 4A-4C respectively illustrate a schematic perspective view, a schematic partial perspective view and a side cross-sectional view of a transport apparatus in accordance with an exemplary embodiment;

FIGS. 7A-7C respectively illustrate a schematic top perspective view, a side cross-sectional view and a schematic bottom perspective view of a transport chamber section in accordance with an exemplary embodiment;

FIGS. 8A-8C respectively show a schematic perspective view, a schematic partial perspective view and a side cross-sectional view of a transport apparatus in accordance with an exemplary embodiment;

FIGS. 12A-12C respectively show a schematic top perspective view, a side cross-sectional view and a bottom perspective view of a transport apparatus in accordance with an exemplary embodiment;

FIGS. 13A-13C respectively show a schematic perspective view, a schematic partial perspective view and a side cross-sectional view of a transport apparatus in accordance with an exemplary embodiment; and FIG. 14 shows a schematic perspective view of a drive section in accordance with an exemplary embodiment;

DETAILED DESCRIPTION

Figure 1:
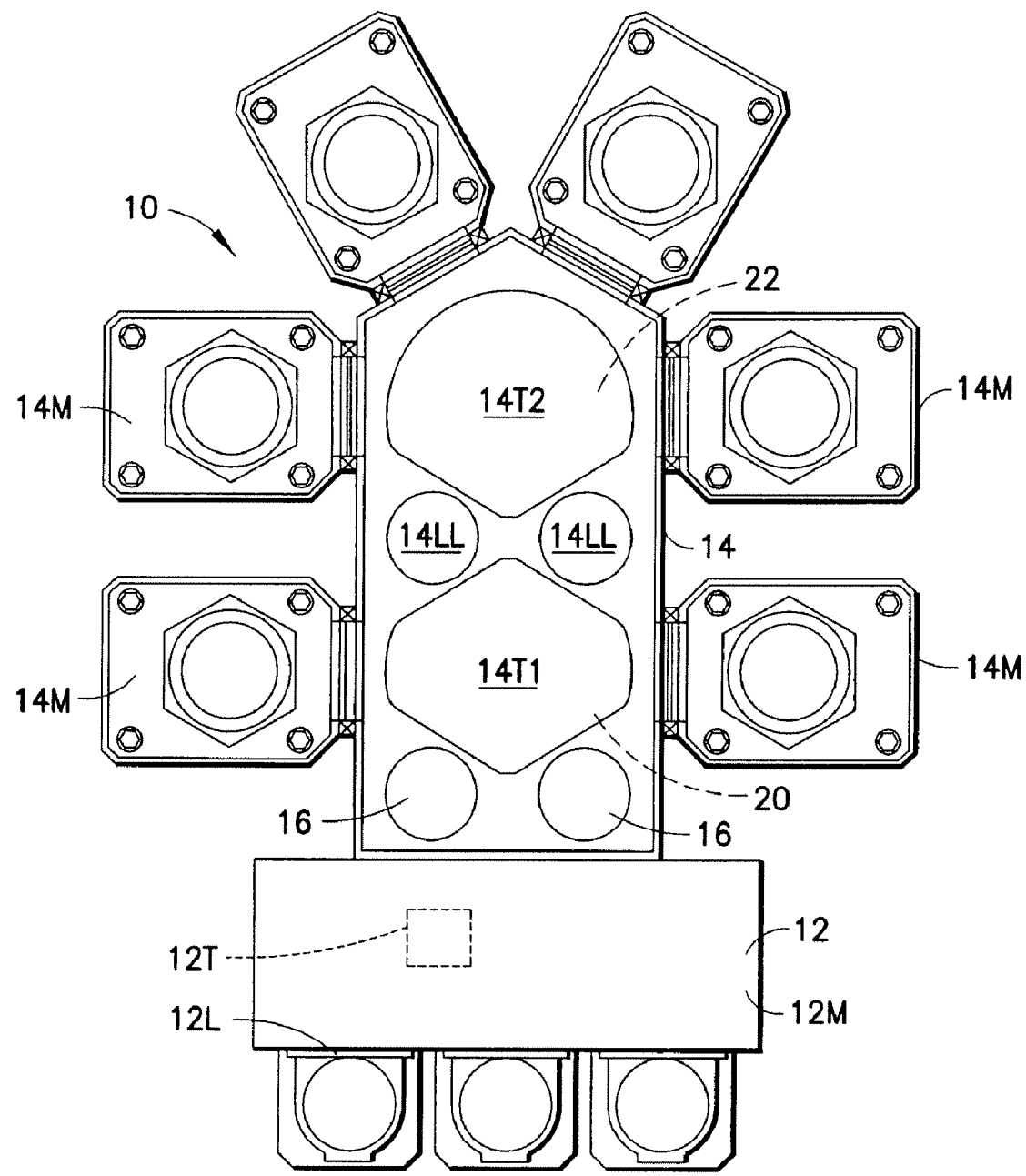
FIG. 1 illustrates a schematic plan view of a substrate processing apparatus in accordance with an exemplary embodiment.

Referring to FIG. 1, there is shown a schematic plan view of a substrate processing apparatus 10 incorporating features in accordance with an exemplary embodiment. Although the exemplary embodiments will be described with reference to the embodiments shown in the drawings, it should be understood that the exemplary embodiments can be embodied in many alternate forms. In addition, any suitable size, shape or type of elements or materials could be used.

The processing apparatus 10, in the exemplary embodiment illustrated in FIG. 1, has a representative configuration, and in alternate embodiments, the apparatus may have any other desired configuration. In the exemplary embodiment shown in FIG. 1 the process apparatus is shown as a cluster tool for exemplary purposes only. It should be realized that that the exemplary embodiments apply equally well to any other suitable type of substrate processing system having transport apparatus including, but not limited to, linear processing systems. Examples of suitable processing systems in which the exemplary embodiments can be incorporated include but are not limited to U.S. patent application Ser. No. 11/442,511, entitled "Linearly distributed Semiconductor Workpiece Processing Tool," filed May 26, 2006, the disclosure of which is incorporated by reference herein in its entirety.

The exemplary processing apparatus 10 shown in FIG. 1 may generally have an interface section 12, that for example may be referred to as a front end module (as may be realized the reference frame used for this description is exemplary, and in alternate embodiments any desired reference frame may be used, for example the interface section may be located at the back, or sides of the apparatus). In the exemplary embodiment shown, the apparatus 10 may include a processing section 14, that is connected to the interface section 12. For example purposes, the interface section 12 may be arranged (for example may have one or more load ports 12L, and suitable transfer system 12T, such as may be located in a suitably environmentally controlled module 12M) to allow substrates, or other desired workpieces, to be loaded and unloaded from the apparatus 10. The transfer system 12T, of the interface section 12, may transfer substrates for example between cassettes at the loading stations of the interface section and the processing section 14, within the suitably controlled environment of the module 12M.

The processing section 14 in the exemplary embodiment, may generally have a number of transport chambers 14T1, 14T2 (two transport chambers are shown in FIG. 1 for example purposes, though in alternate embodiments there may be more or less than two chambers), and a number of processing modules 14M communicably connected to the transport chambers 14T1, 14T2. The processing modules 14M may be configured to perform any desired processes on the substrates, such as for example, thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures or any other desired processes. In the exemplary embodiment, the transport chambers 14T1, 14T2 may be arranged to hold an isolatable atmosphere capable of being isolated from the exterior atmosphere. In the exemplary embodiment, the transport chambers 14T1, 14T2 may be capable of holding a vacuum atmosphere (though in alternate embodiments the transport chamber may hold any other desired isolated atmosphere such as an inert gas N2, Ar, etc.). The transport chambers 14T1, 14T2, in the exemplary embodiment may thus include suitable vacuum pumping system and vent system as will be described further below. In order to maintain the isolated atmosphere without compromise, the transport chamber(s) 14T1, 14T2, of the processing section 14, may communicate with the interface section 12 via loadlocks(s) 16. As may be realized, the process module(s) 14M may be isolated from the transport chamber(s) 14T1, 14T2 by suitable slot valves.

In the exemplary embodiment shown, the transport chambers 14T1, 14T2 may be capable of being isolated from each other. For example, in the exemplary embodiment the transport chambers 14T1, 14T2 may be serially arranged, relative to the front or interface section 12 of the apparatus, and intermediate loadlocks 14LL may be disposed as shown in FIG. 1 between the transport chambers 14T1, 14T2. Accordingly, the transport chambers 14T1, 14T2 may be capable of holding different isolated atmospheres, such as different levels of vacuum, and hence the process modules 14M connected to the respective transport chambers 14T1, 14T2 may be capable of performing different processes having different base pressures. In alternate embodiments, the transport chambers 14T1, 14T2 may not have different atmospheres. In alternate embodiments, the intermediate chambers 14LL, between transfer chambers 14T1, 14T2 may also be configured as substrate buffers, aligners or metrology sections.

In the exemplary embodiment shown in FIG. 1, each transport chamber 14T1, 14T2 may have a transport apparatus 20, 22 mounted respectively therein. As may be realized, transport apparatus 20, located in chamber 14T1, is capable of transporting substrates between loadlocks 16 and processing modules 14M, or intermediate loadlocks 14LL connected to transport chamber 14T1, and transport apparatus 22 is capable of transporting substrates between the intermediate loadlocks 14LL and processing modules connected to the transport chamber 14T2. In alternate embodiments, the transport chamber(s) 14T1, 14T2 of the processing section may have more or fewer transport apparatus. The substrate processing apparatus 10 and its subsections (e.g. interface section 12, processing section 14, transport apparatus 20, 22) may be suitably configured to process any desired substrate including, but not limited to, 200 mm, 300 mm, 450 mm or any other desired diameter substrate (such as may be used in semiconductor manufacture), reticle or pellicle, and flat panels (such as may be used in flat panel display manufacture).

Figure 2A:
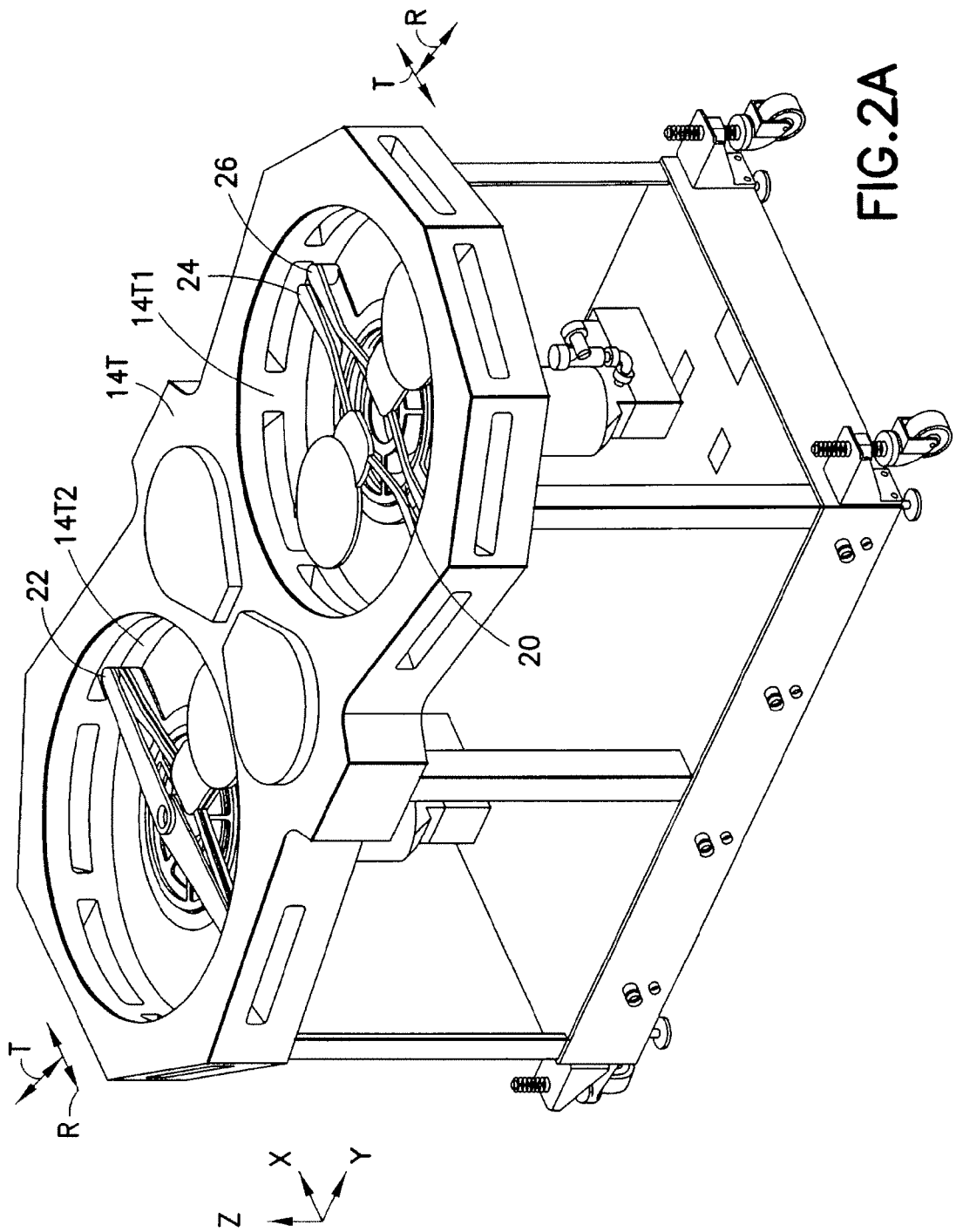
Figure 2B:
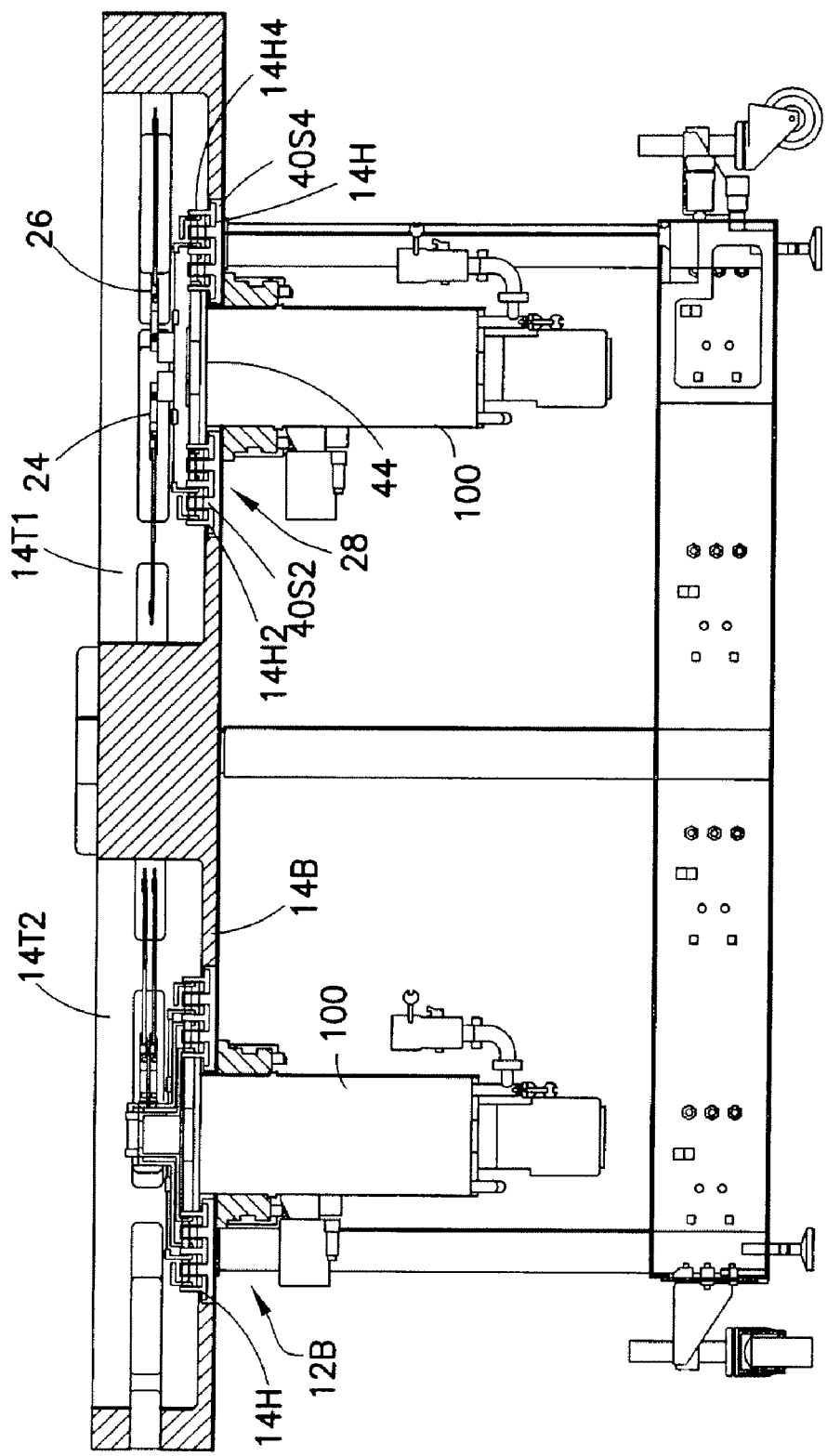

Referring now to FIGS. 2A-2C, there is shown respectively schematic top and bottom perspective and side cross-sectional views of the transport chamber section 14T (in FIG. 2A closure elements are omitted so that chamber interior details are visible). As noted before, the transport chamber 14T1, 14T2 section may include a transport system, in the exemplary embodiment, apparatus 20, 22, to transport substrates through the transport chambers 14T1, 14T2 to and from loadlocks 16 (see also FIG. 1) and the processing modules 14M of the processing section 14. In the exemplary embodiment, the transport apparatus 20, 22 are generally articulated, or movably jointed arms powered by rotary drives with a number of independent axes of rotation to generate desired radial (R) and rotational (T) motion (for example indicated respectively by arrows R, T in FIG. 2A) of transport apparatus end effectors) as will be described in greater detail below. The rotary drives have, what may be referred to for purposes of the description as ring motors with coils that may be incorporated within the walls defining their respective transport chambers 14T1, 14T2, thereby isolating the coils from chamber atmosphere as will also be described further below. In the exemplary embodiment, the arrangement of the drive section motors enables the bottom surface of the transport chamber to be free or otherwise accessible for mounting and interface of for example a vacuum pumping system 100 (see FIGS. 2B, 2C) or other desired systems. In the exemplary embodiment, the arms and drive of the transport apparatus arms may be magnetically levitated, and centered for example with self bearing motors eliminating or substantially reducing potential for particle generation within the chamber atmosphere.

Referring still to FIGS. 2A-2C, in the exemplary embodiment, the transport apparatus 20, 22 in the respective transport chambers 14T1, 14T2 may be different from each other. For example, transport apparatus 20 may have what may be referred to, for description purposes, as a bi-symmetric arm arrangement, and transport apparatus 22 may have a symmetric arm arrangement. In alternate embodiments the substrate transport apparatus may have any other desired arrangement, such as for example a scara arrangement. In other alternate embodiments, the transport apparatus in the transport chambers may be similar. Suitable examples of transport arms can be found in U.S. patent application Ser. No. 12/117,355, entitled "Substrate Transport Apparatus" filed on May 8, 2008, the disclosure of which is incorporated by reference herein in its entirety.

Figure 3B:
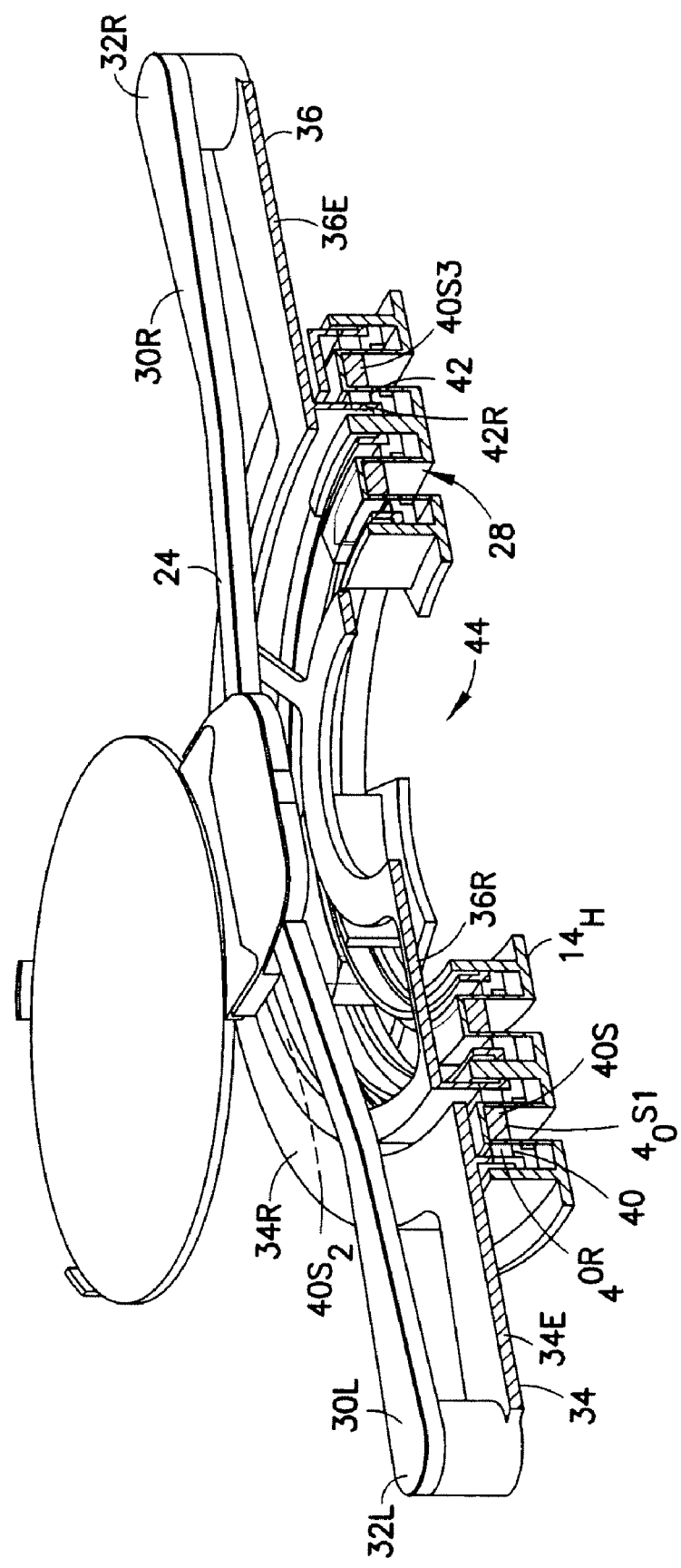

Referring also to FIGS. 3A-3B, there is respectively shown a schematic perspective view and partial perspective view of transport apparatus 20. As noted above, in the exemplary embodiment, transport apparatus 20 may have a bi-symmetric arm arrangement, having for example two arm assemblies 24, 26 (though in alternate embodiments there may be more or fewer arm assemblies). The arm assemblies 24, 26 may be substantially similar to each other, and are arranged in the exemplary embodiment generally opposing each other as seen best in FIG. 3A so that the arms extend and retract in substantially opposite directions. Arm 24 may have one (or more) end effectors 24E (capable of holding a desired number of substrates thereon) and a pair of arm links 30R, 30L on which the end effector 24E is movably mounted (arm assembly 26 is similar and hence, the arm assemblies will be described below with specific reference to arm assembly 24 for illustrative purposes except where noted). As may be realized the bent shape of the arm links 30R, 30L is exemplary and in alternate embodiments the arm links may have any suitable shape including, but not limited to, straight and arcuate. One end of the arm links 30R, 30L may be pivotally mounted at pivots 32L, 32R to respective base members 34, 36, in any suitable manner. The other opposite end of the arm links 30R, 30L may be pivotally joined to the end effector 24E at wrist joint(s) 35R, 35L. In alternate embodiments the arm links 30R, 30L may be pivotally joined to the base members and end effector at any suitable point along the arm links. In the exemplary embodiment, both arm assemblies 24, 26 are mounted or otherwise joined to common base members 34, 36, and via the base members 34, 36 to the drive section 28. In the exemplary embodiment, the drive section 28 may have nested motor(s) providing two independent axes of rotation (T1, T2) and hence two degrees of freedom motion of the arm assemblies 24, 26 (R, T). As may be realized, the bi-symmetric geometry of the arm links of the arm assemblies 24, 26, effects general decoupling of R motion between arm assemblies (e.g. extension and retraction (R movement) of one arm assembly, such as effected by counter rotation of axes of rotation T1, T2, from a battery or retracted position causes little corresponding R movement of the other arm assembly at the battery position). In alternate embodiments, the arm assemblies may be independently coupled to the drive section so each arm assembly may be individually moveable in the R direction. The base members 34, 36 may have any desired shape capable of coupling the outer pivot joints 32L, 32R of the arm links 30L, 30R to the rotors of the drive section motors (the configuration of the base members 34, 36 shown in FIGS. 3A-3B is merely exemplary and in alternate embodiments, the base members may have any other suitable configuration).

As noted before, in the exemplary embodiment shown in FIGS. 3A-3C, the drive section 28 may have nested ring motors 40, 42 (defining independent axes of rotation T1, T2), and the base members 34, 36 may be respectively connected to the corresponding drive motors 40, 42 in a substantially shaftless or hubless manner. As seen best in FIGS. 3A-3B, each base member 34, 36 may have a general hoop section 34R, 36R and extensions 34E, 36E depending therefrom to the corresponding pivot joints 32L, 32R of the arm assemblies 24, 26. In the exemplary embodiment the base members may be substantially flat, such as a sheet metal stamping, though in alternate embodiments, the base member may be formed in any other desired manner from any suitable materials. The hoop sections 34R, 36R, which may be closed or open, are respectively joined to the corresponding ring rotors of motors 40, 42. The hoop sections of the base members may be fastened to the motor rotors in any desired manner (e.g. mechanical fasteners, chemical bonding, etc.). In alternate embodiments, the motor rotors may be otherwise integrated to the base members (for example the base member may have an integrally formed ring of magnetic material configured so as to be capable of operating as a motor rotor). The hoop sections of the base members may extend around and be fastened to as long a section of the rotor circumference as desired. In the exemplary embodiment shown, the nested motors 40, 42 may be located concentrically (their respective axes of rotation T1, T2 being coaxial) so that one of the motors surrounds the other one of the motors, and the base members 34, 36 are configured to allow rotation thereof without interference with each other. In alternate embodiments, the base members and coupling between base members and drive section T1 and T2 motors may be configured in any other desired manner and may include one or more shaft(s) or hub(s).

Figure 5:
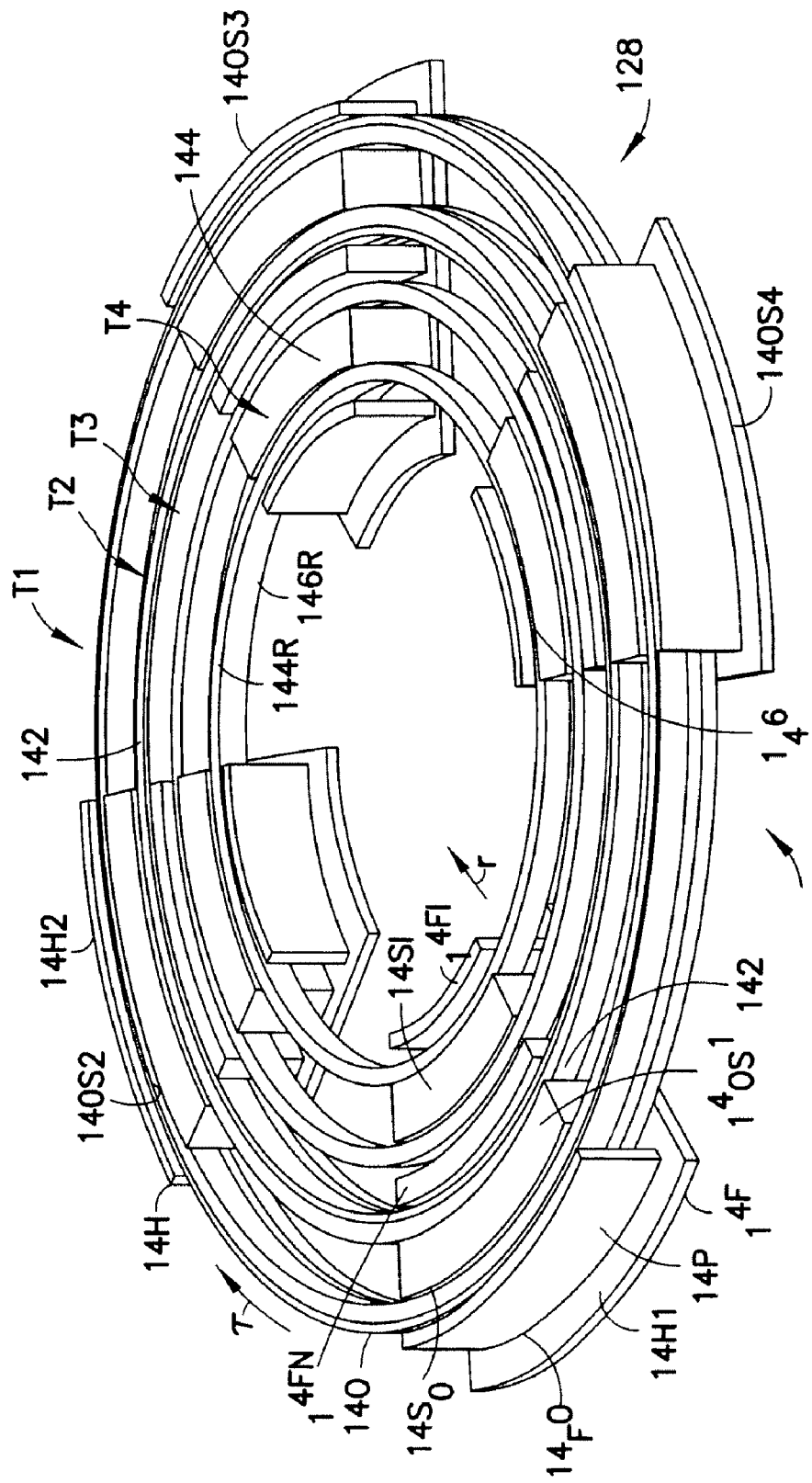
FIG. 5 shows a schematic perspective view of a drive section in accordance with an exemplary embodiment.

Referring now again to FIGS. 2A-2C, in the exemplary embodiment the motors 40, 42 of drive section 28 are integrated into the bottom wall 14B defining the transport chamber(s) 14T1, 14T2. In alternate embodiments the drive section motors may be integrated into any other walls bounding the transport chambers, such as side wall(s) or top wall(s). In the exemplary embodiment, the ring motors 40, 42 of the drive section may be arranged to define a clean or substantially free space 44 (unencumbered with drive system components) interior to the motors for locating or housing other components such as a vacuum pump system 100 (see for example FIGS. 2B and 3B) and associated components for atmosphere control (e.g. pressure gages, sensors, vent system piping not shown). In alternate embodiments the atmosphere control components may be located at any suitable location(s) of the transport chamber(s) 14T1, 14T2. Referring now also to FIG. 5, there is shown a schematic perspective view of a drive section 128 substantially similar to drive section 28 (drive section 128 in the exemplary embodiment illustrated may have motors to define four independent axes of rotation T1-T4, and drive section 28, as noted before, may have two independent axes of rotation). In the exemplary embodiment, the concentrically positioned motors 40, 42 (T1, T2) of drive section 28 may be substantially similar. In alternate embodiments, the drive section may include different types of motors. In the exemplary embodiment, the motors 40, 42 may be synchronous motors such as brushless DC motors. Suitable examples of brushless DC motors are described in U.S. patent application Ser. No. 11/769,688, filed Jun. 27, 2007, U.S. patent application Ser. No. 11/769,651, filed Jun. 27, 2007, and U.S. patent application Ser. No. 12/163,996, filed Jun. 27, 2008 all incorporated by reference herein in their entirety. As noted before, in the exemplary embodiment motors 40, 42 may be similar and hence will be described below with specific reference to motor 40, except as otherwise noted.

As seen in FIG. 3B, the motor windings may be disposed in the stator 40S, and the rotor 40R may have permanent magnets arranged circumferentially in an alternating pole sequence at a desired pitch. In the exemplary embodiment, the rotor 40R may have ferromagnetic backing (or backing of any other suitable magnetic materials) for the permanent magnets. The stator 40S may be arranged in stator segments 40S1-40S4, such as for example four stator segments as can be seen best in FIG. 3A (see also FIG. 5, reference numerals 140S1-140S4), though in alternate embodiments there may be more or fewer stator segments. The stator segments 40S1-40S4 may be geometrically offset (e.g. spaced around the rotor) and electrically offset relative to each other to generate desired resultant forces on the rotor. In the exemplary embodiment, the stator windings and rotor magnets may be capable of generating tangential forces, in the direction of arrow τ in FIGS. 3A and 5, and/or radial forces (r) (see FIG. 5) to provide substantially independently controllable torque (T1, T2) and self bearing centering forces. The windings of one or more of the stator segments 40S1-40S4 may be coupled to each other to form winding set(s) independently controllable and in the exemplary embodiment the motor 40 may have at least two independently controllable winding sets (though in alternate embodiments there may be more or fewer winding sets). Commutation of the windings in segments 40S1-40S4 to provide the desired torque and independent rotor centering may be controlled via suitable algorithms in a controller (not shown). Examples of suitable commutation programs for commutating the windings in stator segments 40S1-40S4 are described in U.S. patent application Ser. Nos. 11/769,688 and 11/769,651 previously incorporated by reference. As may be realized, in the exemplary embodiment rotor centering forces (e.g. radial and or tangential forces may be controlled to effect rotor 40R, 42R, and hence arm assembly 24, 26, motion in the X,Y directions (e.g. two more degrees of freedom in addition to the two axes T1, T2 of rotation from two motors). In alternate embodiments, the rotor may have suitable passive centering such as for example, mechanical contact (e.g. shafts, bearings, etc.) or magnetic non-contact centering.

Figure 6:
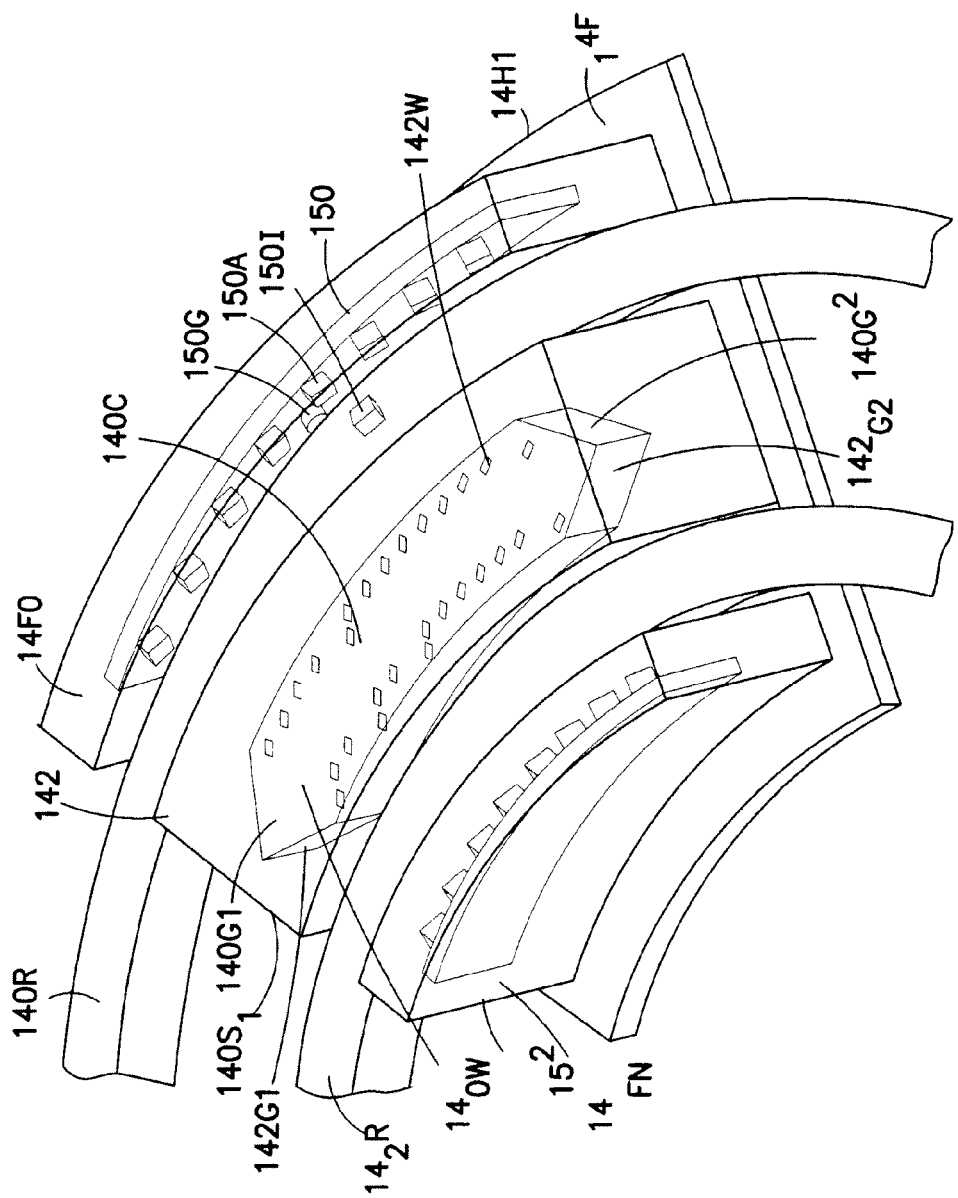
FIG. 6 illustrates a partial perspective view of a stator segment and rotors of the drive section of FIG. 5.

In the exemplary embodiment, the motors 40, 42, which may be concentrically adjoining, may be configured to use or share common or combined stator segments located for example between the rotors. This is seen best in FIG. 6, which illustrates a partial perspective view of a stator segment, such as for example, stator segment 140S1, and rotors 142R, 140R of drive section 128. Stator segment 140S1 and rotor sections 140R, 142R are representative of a suitable stator segment. Rotors 40R, 42R and stator segments 40S1 of drive section 28 (see FIG. 3A) are similar. As seen in FIG. 6, in the exemplary embodiment, the stator segment 140S1 may have a core section 140C, made for example of suitable magnetic material. The configuration of the core section 140C shown in FIG. 6 is exemplary, and in alternate embodiments, the core section may have any desired configuration. The core section 140C may include winding slots or teeth, for both windings 140W, 142W of both motors 140, 142 which are similar to motors 40, 42 (see FIG. 3B). In the exemplary embodiment, the core section 140C may be of unitary construction, though in alternate embodiments, the core section may be a combined assembly. The winding slots 140W, 142W may be disposed respectively on opposite sides of the core 140C to face their corresponding motor rotors 140R, 142R. The winding slots 140W, 142W in the core 140C are illustrated as being substantially symmetrical for example purposes only, and in alternate embodiments, the winding slots in the core for each motor stator may be different (such as corresponding to the configuration and operating parameters of the given motor). In other alternate embodiments, one or more slots or gaps (for example extending concentrically with the faces of the core) may be formed in the core section in order to provide a desired magnetic configuration to the core. Suitable examples of stator segments are described in U.S. patent application Ser. No. 12/163,993, filed Jun. 27, 2008 incorporated by reference herein in its entirety. As may be realized, and seen in FIG. 6, the rotors 140R, 142R (similar to rotor 40R, 42R shown in FIG. 3B) operating with combined stator segment 140S1 may be configured accordingly. For example, the rotors 140R, 142R may have the permanent magnets positioned to face the corresponding windings on the combined core section 140C located in between the rotors 140R, 142R. Hence, the permanent magnets on the respective rotors 140R, 142R may be facing each other (as may be realized, the gap between rotors may be sized and/or suitable materials may be positioned within the chamber wall to avoid magnetic influence between rotors). In alternate embodiments the permanent magnets may have any suitable orientations with respect to each other. In still other alternate embodiments, the motor stators and rotors may have any other suitable configuration.

In addition to torque τ and centering (r) forces, in the exemplary embodiment the motors 40, 42 may be capable of generating lift forces without contact (e.g. Z forces, see FIG. 3A). For example, the rotor magnets and stator core may be so positioned to generate passive lift, stably holding the rotor, and hence the arm assemblies in the Z direction via, for example, magnetic levitation. The configuration of the stator segments 40S1-40S4 and rotors 40R, 42R of motors 40, 42 may be established to generate desired stiffness of the rotor(s) 40R, 42R in the Z direction and rotor stiffness for pitch and roll (respectively rotation of the rotor about Y and Z axes). A suitable example of rotor and stator configuration having passive Z lift with desired rotor stiffness in Z direction and pitch and roll is described in U.S. patent application Ser. No. 12/163,993 previously incorporated by reference. In one embodiment, the drive section, such as drive section 28, may be capable of providing Z axes motion to the arm assemblies. In one exemplary embodiment, for example, the stator segments 40S1-40S4 may be positioned on an actuable platform or carriage (not shown) having controllable Z travel. As maybe realized the actuable platform or carriage may be driven by any suitable motor including, but not limited to, self bearing actuators and screw drives. A suitable seal may be provided between the actuable platform and the internal volume of the transport chamber to prevent particulates that may be generated from the Z-drive from entering the transport chamber. In alternate embodiments, the motor rotor and/or stator may be configured to generate active Z forces enabling Z travel of the rotor(s) 40R, 42R, relative to the stator(s) 40S1-40S4, and hence of the arm assemblies 24, 26 within the transport chamber(s) 14T1, 14T2. In other alternate embodiments, the drive section 28 may not be capable of generating Z-travel of the arm assemblies.

Referring again to FIG. 6, the stator segments 140S1 (similar to segments 40S1-40S4, see FIG. 3B) may have anti-cogging features 140G1, 140G2, 142G1, 142G2. In the exemplary embodiment, the combined stator segment 140S1 may have anti-cogging features for both rotors 140R, 142R of motors 140, 142. The anti-cogging features, of each stator segment (such as segments 40S1-40S4), as well as the combined or collective effect of the anti-cogging features (similar to features 140G1, 140G2, 142G1, 142G2) of some or all the stator segments 40S1-40S4 eliminates or reduces motor cogging to pre-determined levels, for accurate substrate positioning with the transport apparatus, in at least the Z direction, the radial (r) direction and rotationally (for the T1, T2 axes) during motor operation. A suitable example of anti-cogging features on motor stator segments is described in U.S. patent application Ser. No. 12/163,993 previously incorporated by reference.

Figure 3C:
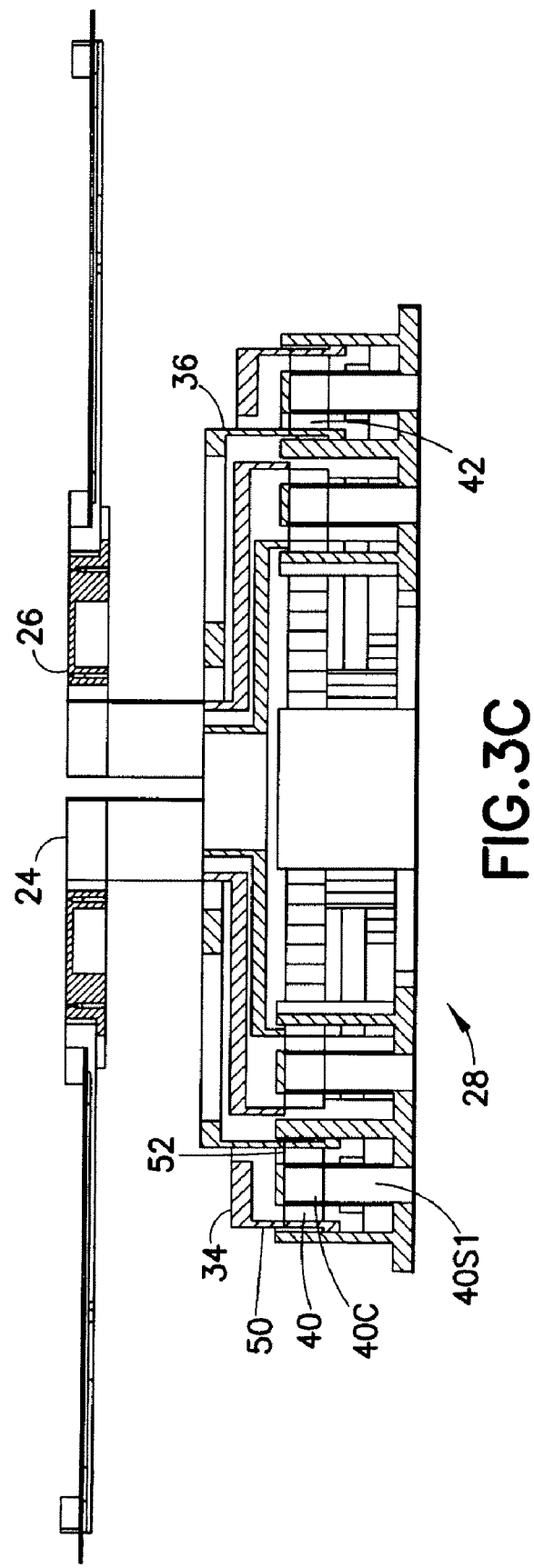

Referring to, for example, FIG. 3C, in the exemplary embodiment, the motors 40, 42 may have suitable position feedback systems 50, 52. The position feedback systems 50, 52 may be non-invasive with respect to the isolated atmosphere in the transport chamber, as will be described below. The feedback system 50, 52 for motors 40, 42 may be generally similar to the feedback system 150, 152 shown in FIG. 6.

The feedback systems 150, 152 for each rotor may be similar to each other and may generally incorporate sensors 150A, 150G, 150I and target indexing to establish absolute and incremental rotational position, as well as radial or centered position of the rotor 140R, 142R. In alternate embodiments, the sensors 150A, 150G, 105I may provide feedback information for any one or more of the absolute and incremental rotational position and the radial position. For example, the sensors 150A, 150G, 150I may be electromagnetic sensors such as Hall effect sensor, or may be optical or other beam sensors. In other alternate embodiments the sensors may be any suitable sensors, including but not limited to inductive sensors. The sensors may be located outside the chamber as will be described further below. In alternate embodiments the sensors may be located in any suitable position relative to the motors 40, 42. In the exemplary embodiment, the rotor backing may have target indexing or any other suitable positional scale located thereon, that is sensed or otherwise read by the corresponding sensors 150A, 150G, 150I to establish the rotor position as noted above. In the example shown in FIG. 6, sensors 150A (eight sensors are shown for example purposes, though there may be more or fewer than eight sensors) may sense a corresponding target index track on the rotor backing indexed to establish absolute rotational position of the rotor 140R. Sensors 150I (two sensors are shown for example, though there may be more or less than two sensors) may sense a corresponding target index track on the rotor backing indexed to establish incremental rotational position of the rotor, and sensor 150G (one is shown for example, though there may be more than one sensor) may sense a corresponding target track on the rotor backing to sense the radial gap position, and hence centering position of the rotor 140R. In alternate embodiments, there may be more or fewer sensors (for example sensor data from one or more sensors may be used to establish more than one position parameter of the rotor). As may be realized, while three different target index tracks are described above, in alternate embodiments there may be more or less than three target index tracks having any suitable configuration to allow for the sensing of any number of feedback characteristics of the motors, such as those described above. A suitable example of a position feedback sensor system 50, 52 is described in U.S. application Ser. No. 12/163,984, filed Jun. 27, 2008 incorporated by reference herein in its entirety. Sensors similar to sensors 150A, 150I, 150G may be positioned as desired in predetermined locations with respect to the rotor(s) as will be described further below.

As noted before, in the exemplary embodiment the drive section 28 may be integrated within the bottom wall 14B of the transport chamber (see for example FIG. 2B). As seen in FIGS. 2B-2C, the lower or exterior surface of the bottom wall is substantially free of drive section components. As also noted before, the motor stator 40S, 42S and feedback position system 50, 52 (see also FIG. 3C) may be isolated from the interior atmosphere of the transport chamber 14T1. Moreover, as may be realized from FIG. 2B, the isolated motor stators 40S, 42S and feedback systems 50, 52 (as well as the rotors 40R, 42R within the isolated atmosphere) may be located, at least in part, within the SEMI specified height of the transport chamber. As seen best in FIGS. 2B and 5, the stators and feedback system sensors may be located inside an isolation casing or cover 14H that is mounted to the bottom wall 14B of the chamber and has a wall 14P that isolates the stators and feedback sensors within the cover 14H from interior of the transport chamber 14T1, 14T2. The cover 14H may be configured with housing channels for the stators and grooves for the rotors of the respective motors (for example, as shown in FIGS. 3B, 4B) so that the stators and rotors are embedded at least impart in what may be referred to for description purposes, as the peripheral wall of the transport chamber.

In the exemplary embodiment, the cover 14H may be segmented into cover segments 14H1-14H4 (see FIG. 3A and also FIG. 5) generally conforming to the stator segments 40S1-40S4. In the exemplary embodiment, the cover segments may be similar to each other, and will be described further below with specific reference to cover segment 14H1. The cover segment 14H1 may be of unitary construction and be made of any suitable material (such as aluminum or other non-magnetic material). In alternate embodiments the cover segment 14H1 may not have a unitary construction. The cover segment 14H1 may be shaped to form a flange 14F (see e.g. FIG. 5) or seating surface for seating against the transport chamber wall (for example bottom wall 14B) to close and isolate the transport chamber interior. The cover segment 14H, in the exemplary embodiment shown in FIG. 5, may have recess sections 14SO, 14S1 for the motor stator segments (e.g. stator segments 40S1-40S4 may be located inside recess 14SO of the cover segment). FIG. 5 illustrates a portion of cover segment 14H1, which shows stator segment 140S1 (similar to stator segment 40S1) located inside cover recess 14SO. As noted before, the wall 14P of the cover, is located between the stator and interior of the transport chamber and thus isolates the stator from the isolated atmosphere inside the transport chamber.

In the exemplary embodiment, the cover segment may also include recess sections 14FI, 14FN, 14FO as shown for sensors, such as sensors 150A, 105G, 150I of the feedback systems 50, 52 (see also FIG. 6 which shows sensor portions of feedback systems 150, 152 respectively located inside corresponding recess sections 14FN, 14FO of the cover segment). Hence, in the exemplary embodiment, recess sections of the cover segment 14H position the stator segments and position feedback systems, located therein, within the bottom wall of the transport chamber yet isolated (by the cover segment wall located in between) from the atmosphere of the transport chamber. Sensors 150A, 150I, 150G may be capable of sensing the target indexes through the cover wall 14P. In embodiments having optical sensors, the cover wall 14P may include transparent sections or windows allowing sensor reading while maintaining isolation between chamber interior and sensor. The stator segments 14S1-14S4 and feedback system sensors 50, 52 may be mounted to their respective cover segment 14H1-14H4 so that the covered stator segment and corresponding feedback system portion may be installed and removed from the transport chamber as a unit module. In alternate embodiments, each of the stator cover, stators and feedback system sensors may be individually installed and removed.

As seen best in FIG. 2C, in the exemplary embodiment, the bottom wall 14B of the transport chamber(s) 14T1, 14T2 may have openings 200 for admitting installation of the cover segments 14H1-14H4 into the bottom wall 14B. In alternate embodiments the openings may be located on any suitable side of the transport chamber(s) 14T1, 14T2 for the installation of the cover segments 14H1-14H4. As also seen in FIG. 2C, the vacuum pump (and/or vent) system 100 may be mounted to the exterior surface of the bottom wall 14B. The pump system 100 may access the chamber interior through the access space 44 defined within the drive section as described before.

Figure 4A:
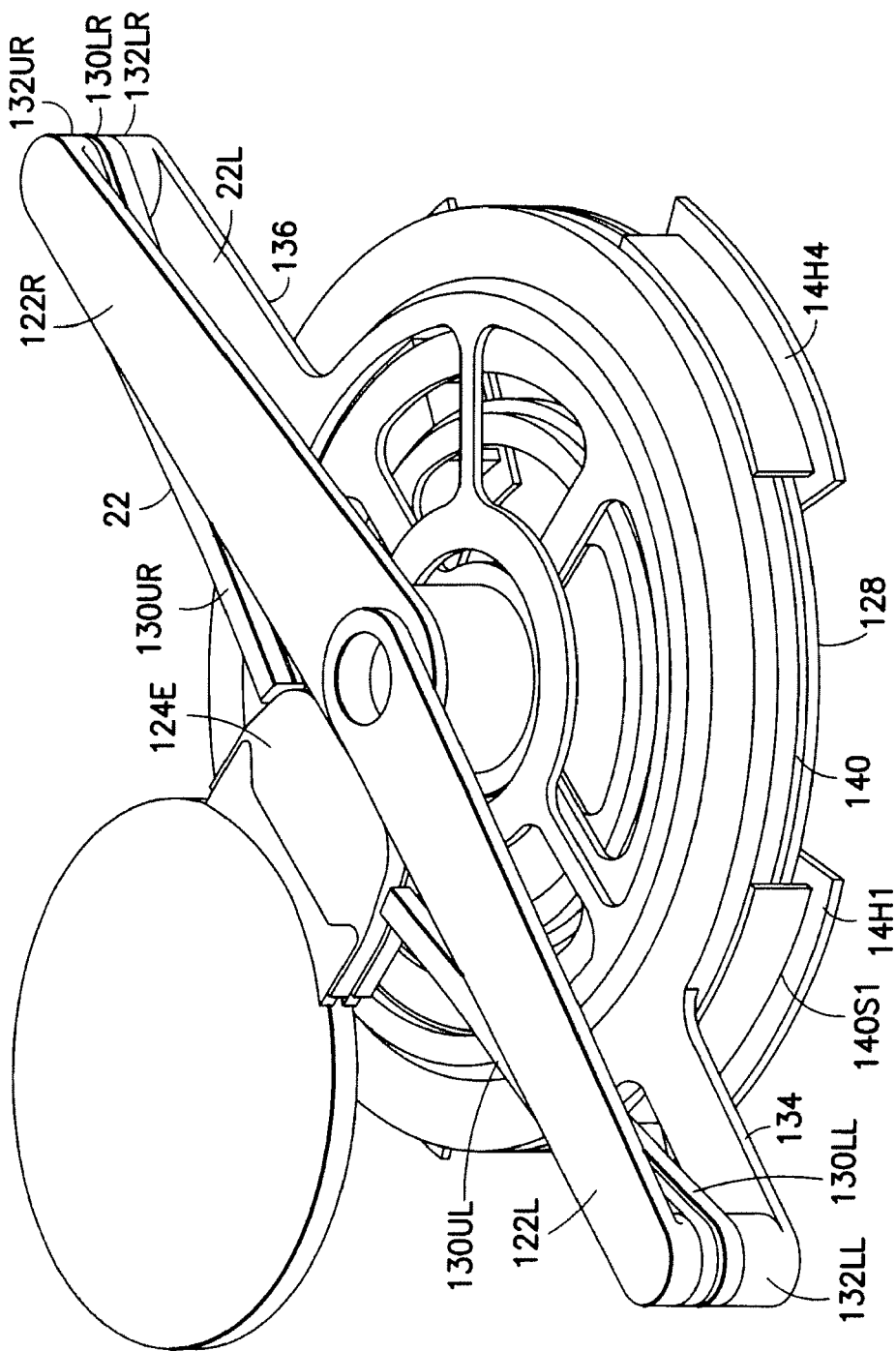
Figure 4C:
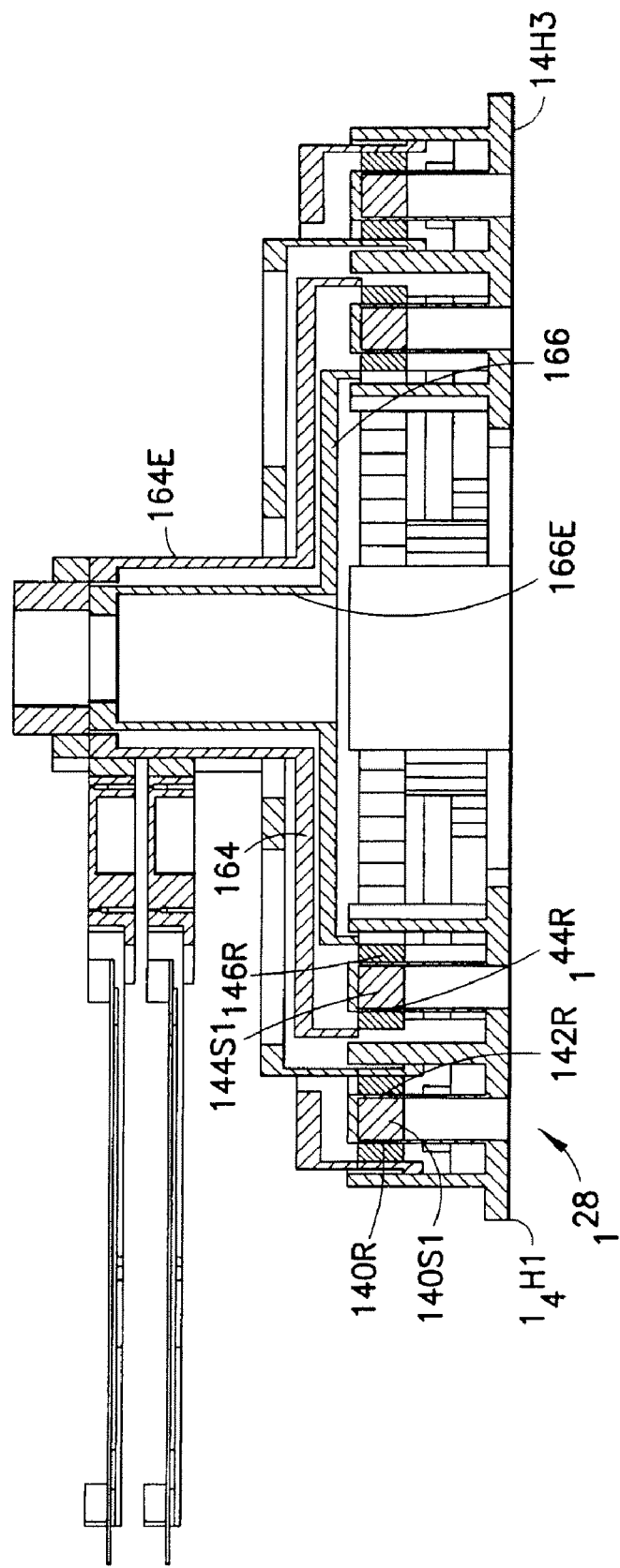

Referring now to FIGS. 4A-4C there is shown a transport apparatus 22 in accordance with another exemplary embodiment. As noted before, apparatus 22 may have a symmetric arm arrangement with, in the example shown, two symmetrical arm assemblies 22U, 22L facing substantially the same direction. The arm assemblies 22U, 22L may be coupled to a drive section 128 with motor arranged to generate four rotation axes (T1, T2, T3, T4) as shown for example in FIG. 5. In one exemplary embodiment, motion of the arm assemblies 22U, 22L may be independently controlled. In other exemplary embodiments the motion of the arm assemblies may be controlled in any suitable manner. Arm assemblies 22U, 22L are substantially similar to each other, and to arm assemblies 24, 26 described previously. In alternate embodiments the arm assemblies 22U, 22L may not be similar to each other. In this example, similar features are similarly numbered. The lower arm assembly 22L may have symmetric arm links 130LR, 130LL linking the respective end effector 124E to base members 134, 136. The base members 134, 136 may be coupled motors 140, 142 of drive section 128 which generate rotation axes T1, T2 (for T and R motion of arm 22L). Motors 140, 142, 144, 146 may be substantially similar to each other, and to motors of drive section 28 as noted before. In alternate embodiments, one or more of the motors 140, 142, 144, 146 may be different from each other. The upper arm assembly may have symmetric arm links 130UL, 130UR linking the respective end effector 124E to base arms 122L, 122R. As seen best in FIGS. 4A-4B, the base arm links 122L, 122R may be fixed respectively to base members 164, 166 that in turn are respectively coupled to corresponding motors 144, 146 generating rotation axes T3, T4 (for T and R motion of arm 22U). Base members 164, 166 may be generally similar to base members 34, 36, but may have extension members 164E, 166E extending generally upwards to mate with the base arms 122R, 122L. In the exemplary embodiment, the extension members 164E, 166E may be coaxial, and may be offset vertically from the motor rotors as desired to maintain a substantially open area within the drive section 128 similar to access area 44 shown in FIG. 3B. As may be realized, the base members may include rotors 144R, 146R as can be seen in FIG. 4B. In one embodiment the rotors 144R, 146R may be mounted to the base members 164,166 in substantially the same manner and be substantially similar to rotors 140R, 142R described above with respect to FIG. 6. The arm assemblies 22U, 22L and drive section 128 may be mated to, for example, the bottom wall 14B of the transport chamber in a manner substantially similar to that of arm assembly 24, 26 and drive section 28 described before. In alternate embodiments, the arm assemblies 22U, 22L and drive section 128 maybe mated to any suitable wall of the transport chamber in any suitable manner.

Referring now to FIGS. 7A-7C, there is shown schematic top perspective, side cross sectional and bottom perspective views of a transport chamber section 714T of a processing apparatus in accordance with another exemplary embodiment. Transport apparatus 722, 723 in the transport chamber 714T1, 714T2 may include bi-symmetric arm assemblies 724, 726 and symmetric arm assemblies 722U, 722L. In the exemplary embodiment, the arm assemblies 724, 726, 722U, 722L are powered by their respective drive sections 728, 728U, 728L which may be incorporated into the peripheral side walls 714W of the transport chamber. In one embodiment the, drive sections 728, 728U, 728L may be embedded within the wall 714W or mounted on a surface of the wall 714W and may or may not be isolated from an internal atmosphere of the transport chamber(s) 714T1, 714T2.

Figure 8B:
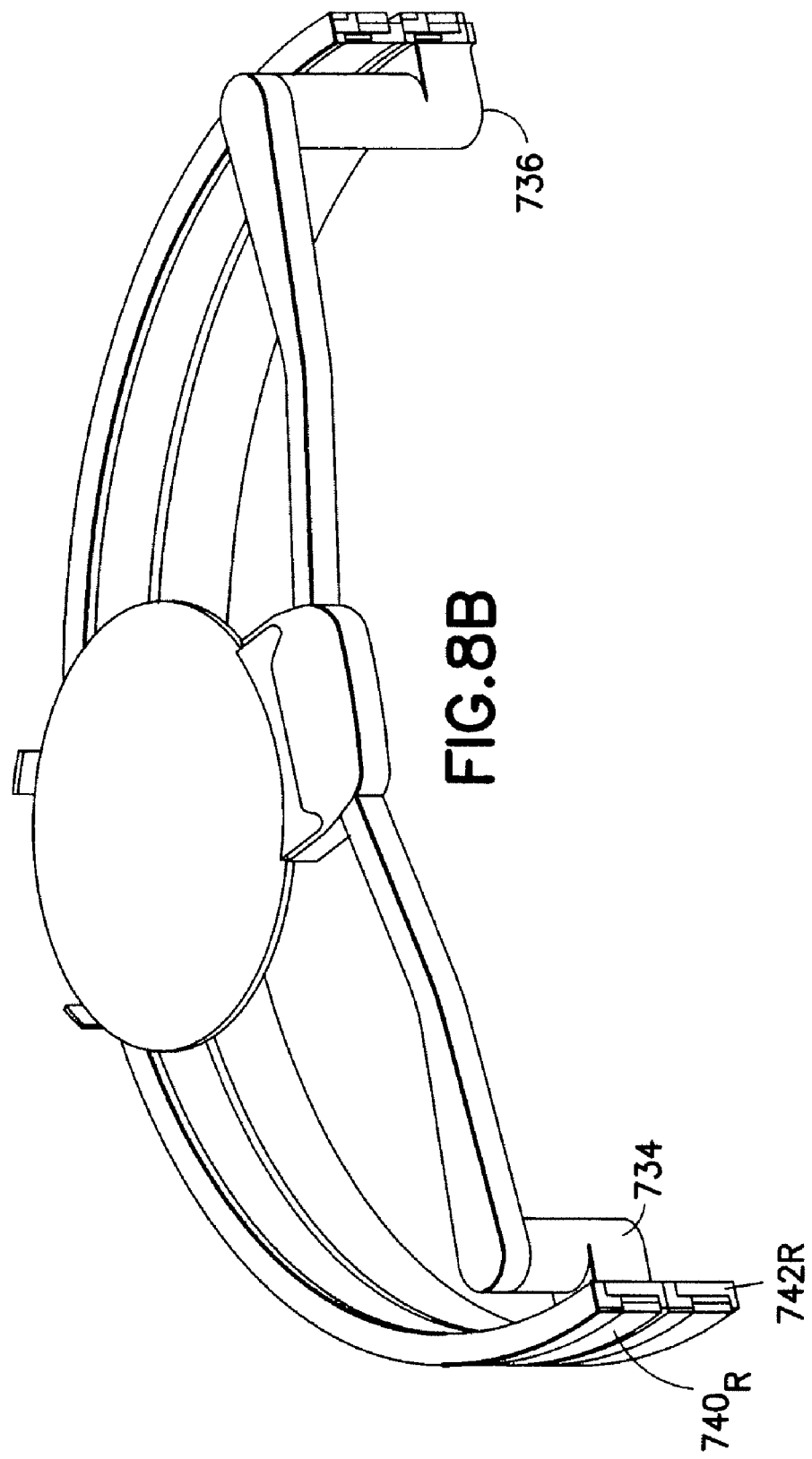
Figure 8C:
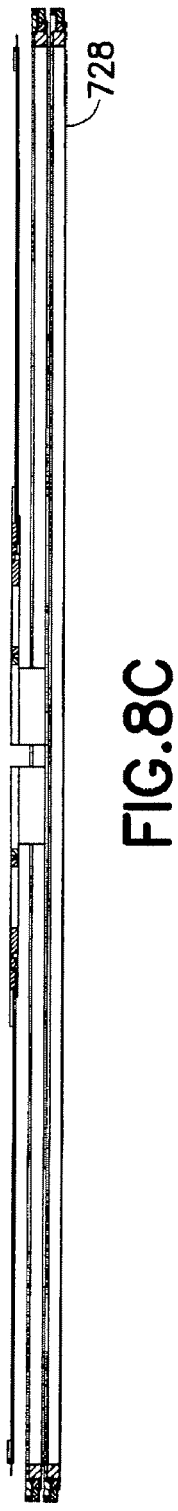

As seen best in FIGS. 8A, 8B, bi-symmetric transport apparatus 723 is shown. The transport apparatus 723 may be substantially similar to transport 20 described above with respect to, for example, FIGS. 2A-2C except as otherwise noted. In this exemplary embodiment, the arm links 730L, 730R of arm assemblies 724, 726 may be pivotally linked to base members 734, 736 respectively. The base members 734, 736 may be coupled to rotor hoops 740R, 742R, of motors of drive section 728 (for generating T1, T2 rotation). In the exemplary embodiment, the rotor hoops 740R, 742R may extend exterior of the pivots 732L, 732R of the arm links 730L, 730R, such that the base members 734, 736 may depend from the interior face of the rotor hoops. In alternate embodiments, the base members may depend from any suitable face (e.g. including top, bottom and exterior face) of the rotor hoops. In the exemplary embodiment, the rotor hoops 740R, 742R may be arranged in a general stacked configuration. In alternate embodiments the rotor hoops may have any suitable spatial relationship with respect to each other. As may be realized, the bi-symmetric geometry of the arm links of the arm assemblies 724, 726, effects general decoupling of R motion between arm assemblies (e.g. extension and retraction (R movement) of one arm assembly, such as effected by counter rotation of axes of rotation T1, T2, from a battery or retracted position causes little corresponding R movement of the other arm assembly at the battery position). In alternate embodiments, each of the arm links of the two arms 724, 726 may be independently coupled to its own respective motor so each arm assembly may be individually moveable in the R direction.

Figure 9:
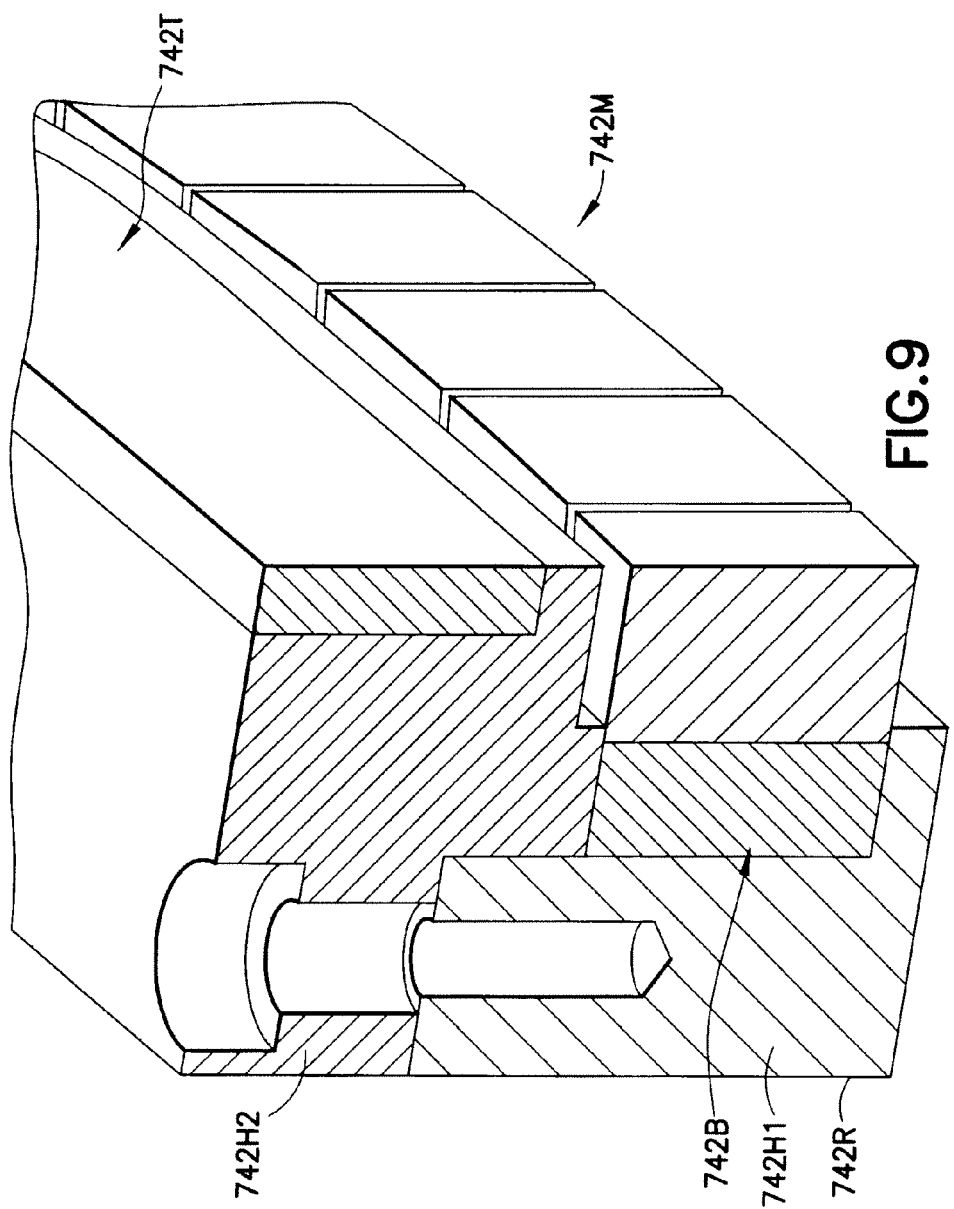
FIG. 9 illustrates a cross section of a representative rotor of the transport apparatus of FIG. 8A.

In the exemplary embodiment, the rotor hoops 740R, 742R may be generally similar to rotors 40R, 42R described previously. Referring now to FIG. 9 a cross section of a representative rotor hoop 742R is shown in greater detail. The rotor hoop 742R may generally include permanent magnets 742M mounted on ferromagnetic backing ring 742B, and sensor target tracks 742T suitably indexed for rotor position determination. As seen in FIG. 9, in the exemplary embodiments, the permanent magnets 742M and sensor tracks 742T are located to face outwards. In alternate embodiments the permanent magnets and sensor tracks may face in any suitable direction relative to the rotor hoop. In the exemplary embodiment, the rotor hoop 742R may be an assembly, with the rotor backing 742B and permanent magnets 742M mounted on a hoop support section 742H1, and the sensor track 742T mounted on hoop support section 742H2 that are connected to form motor hoop 742R using suitable fasteners. In alternate embodiments the hoop support sections 742H1, 742H2 may be joined together in any suitable manner including but not limited to any suitable mechanical or chemical fasteners. In the exemplary embodiment, the hoop support sections 741H1, 742H2 may be formed from any suitable material such as non-magnetic metal including, but not limited to, for example, aluminum alloys. As seen best in FIG. 10, the motor stators 740S, 742S may be arranged in any suitable number of stator segments (six are shown for example purposes) similar to those described before (with respect to e.g. FIGS. 5 and 6), that may be housed in isolating casings 714HU, 714HL in combination for example with sensors of the position feedback system. It is noted that in FIG. 10 two sets of motor stators 710S1, 740S2 are shown for exemplary purposes only. As may be realized from FIG. 10, the transport may have any suitable number of stator sets arranged in, for example, a generally stacked configuration.

Figure 10:
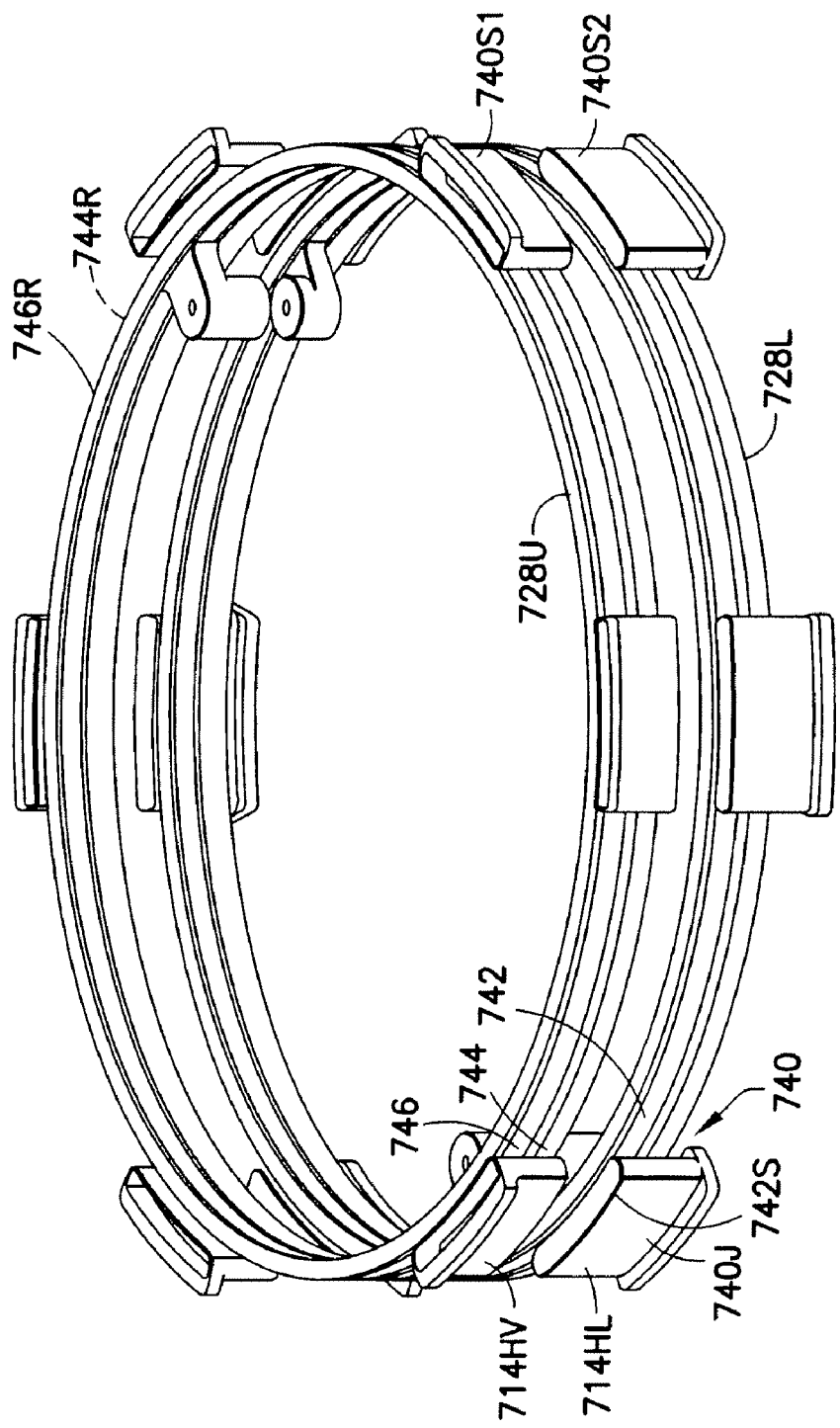
FIG. 10 shows a portion of a motor in accordance with an exemplary embodiment.
Figure 11:
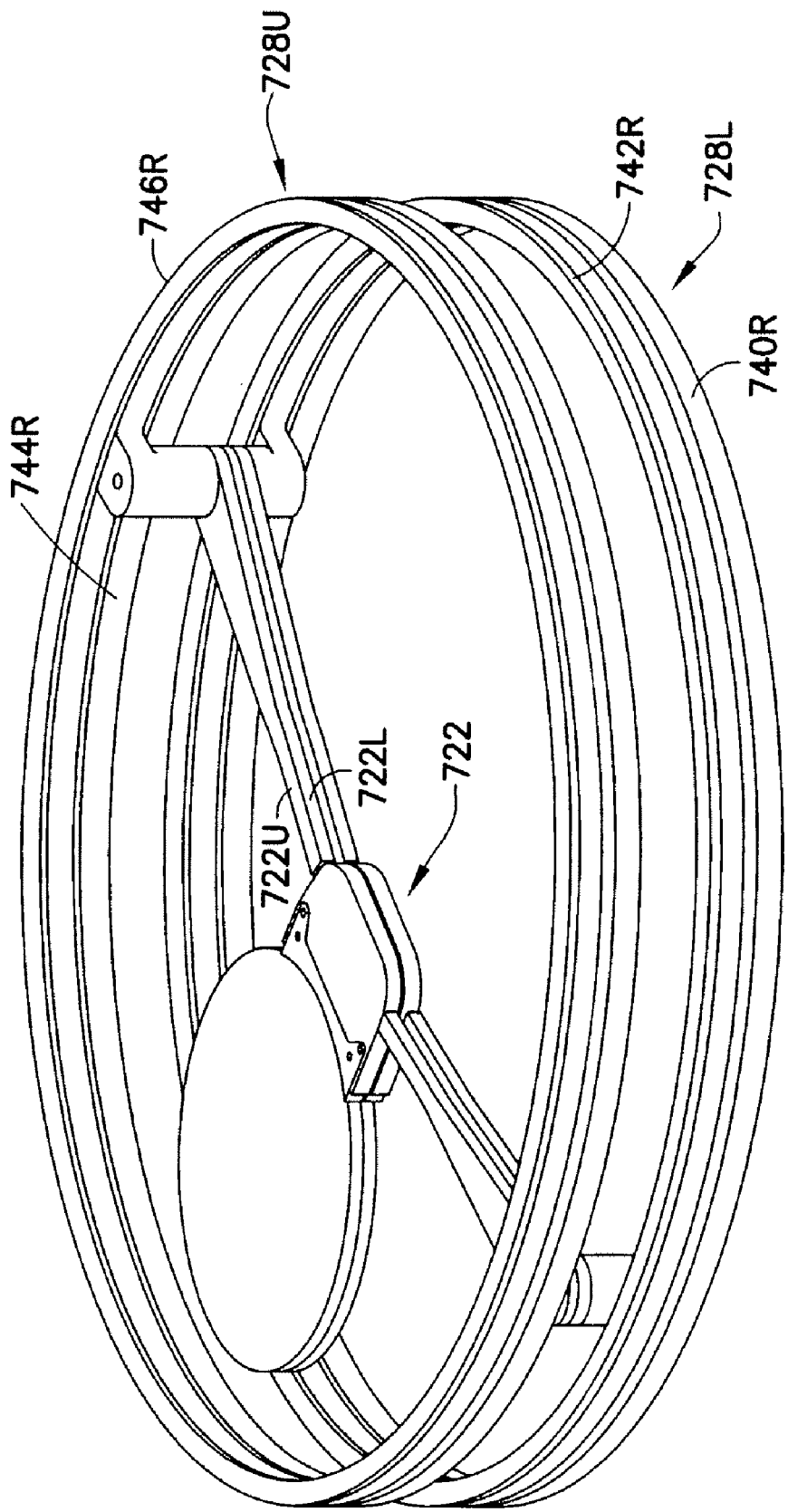
FIG. 11 illustrates a transport apparatus, a portion of which is shown in FIG. 9, in accordance with an exemplary embodiment.

FIG. 11 shows transport apparatus 722 with symmetric arm assemblies 722U, 722L connected to respective rotor hoops 740R, 742R, 744R, 746R (for generating axes of rotation T1, T2, T3, T4) of drive section 728U, 728L. As may be realized from FIGS. 9-10, in the exemplary embodiment, the drive section 728L, 728U may be arranged with motors 740, 742 located under the transport arm assemblies 722L, 722U, and motors 744, 746 located above the arm assemblies so that as the arms are extended and retracted they pass between the motors 740, 742 and 744, 746. The motors 744, 746 of the upper drive section 728U, (T3, T4 rotation) may power the upper arm assembly 722U, and the motors 740, 742 of the lower drive section 728L (T1, T2 rotation) may power the lower arm assembly 722L. The upper rotor hoops 744R, 746R may also be driven by stators 740S as shown in FIG. 10. Each of the stators 740S may be modular units capable of being separately installed or removed from the transport chamber 714T. In alternate embodiments multiple stators may be joined to or have a unitary construction with each other, such as for example, stators that are arranged adjacent each other (e.g. stacked above one another such as stators 740S1, 740S2) may be joined so they can be removed or installed as a unit. As may be realized from FIGS. 7A, and 7C access slots 714SU, 714SL may be formed into the upper and/or lower surfaces of the peripheral chamber walls 714W for installation of the respective stator casings 714HU, 714HL for the upper and lower drive sections 728U, 728L.

Figure 12B:
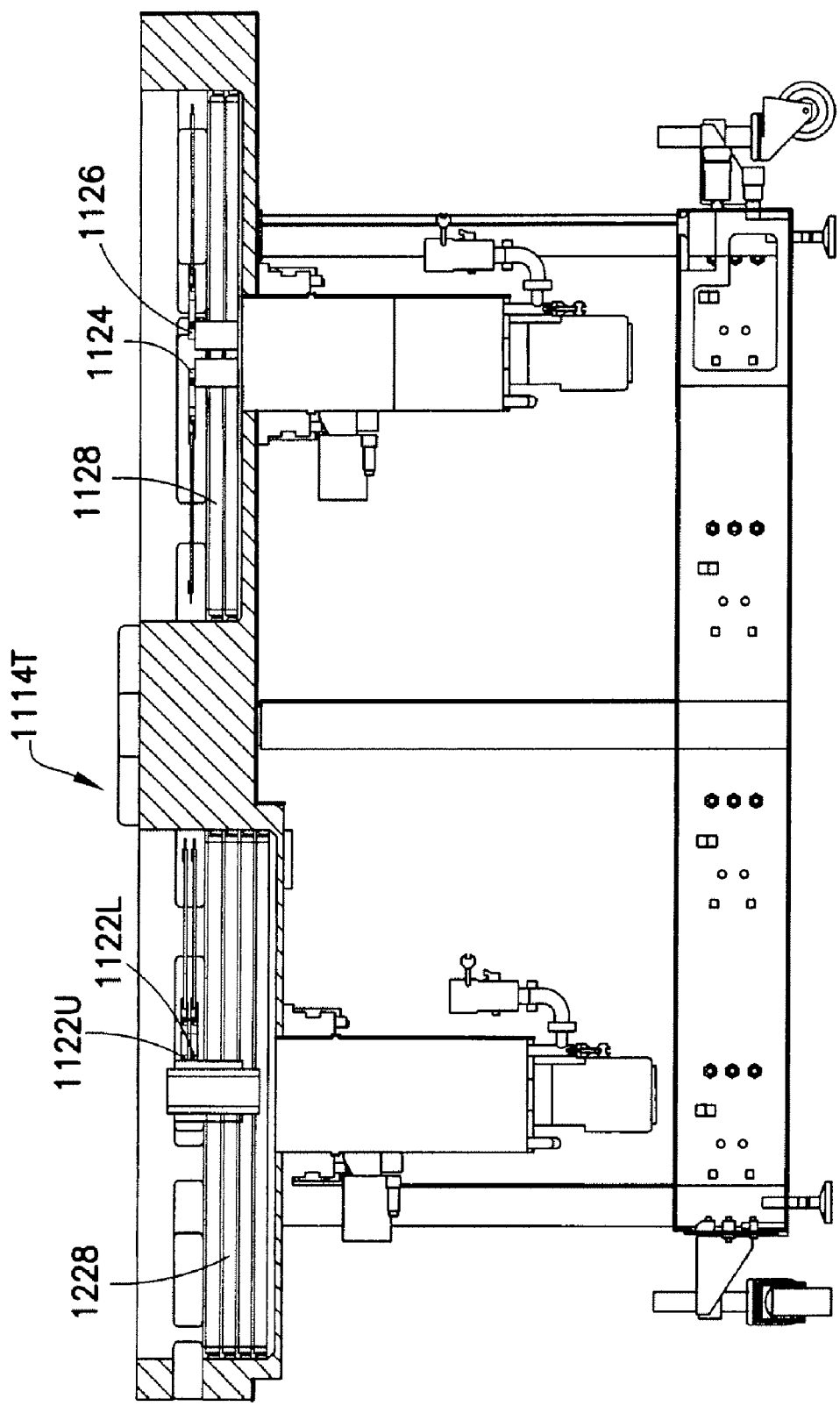
Figure 12C:
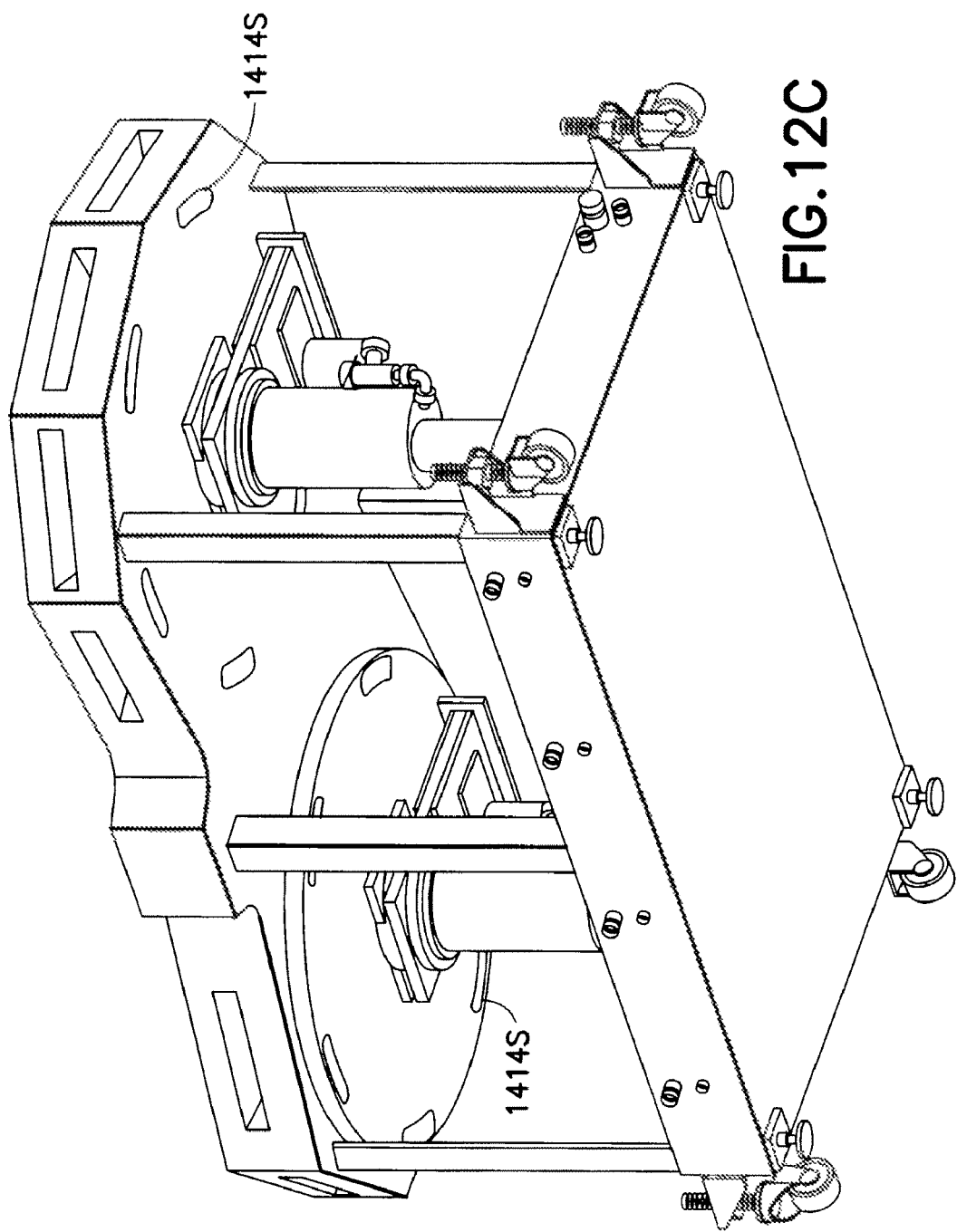

Referring now to FIGS. 12A-12C there is shown top perspective, side cross section and bottom perspective views of a transport chamber section 1114T in accordance with another exemplary embodiment. Transport chamber section 1114T may be similar to transport chamber section 714T except as otherwise noted. Section 1114T may include transport apparatus with arm assemblies 1122U, 1122L and 1124, 1126. Arm assemblies 1124 and 1126 are substantially similar to arm assemblies 724, 726, described before and shown in FIG. 7A, and are coupled to drive section 1128, substantially similar to drive section 728 described previously. In the exemplary embodiment, arm assemblies 1122U, 1122L are generally similar to arm assemblies 722U, 722L and are connected to drive section 1228 that has motors 1240, 1242, 1244, 1246 to generate rotation about axes T1, T2, T3, T4; see also FIG. 12D).

Figure 13C:
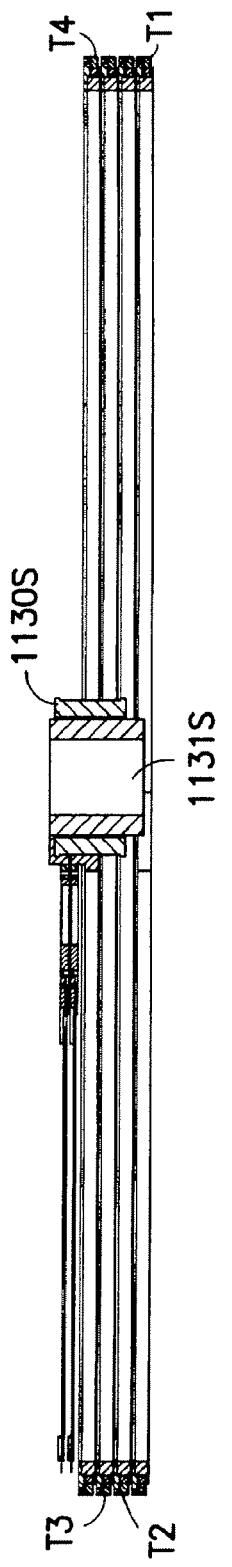
Figure 13A:
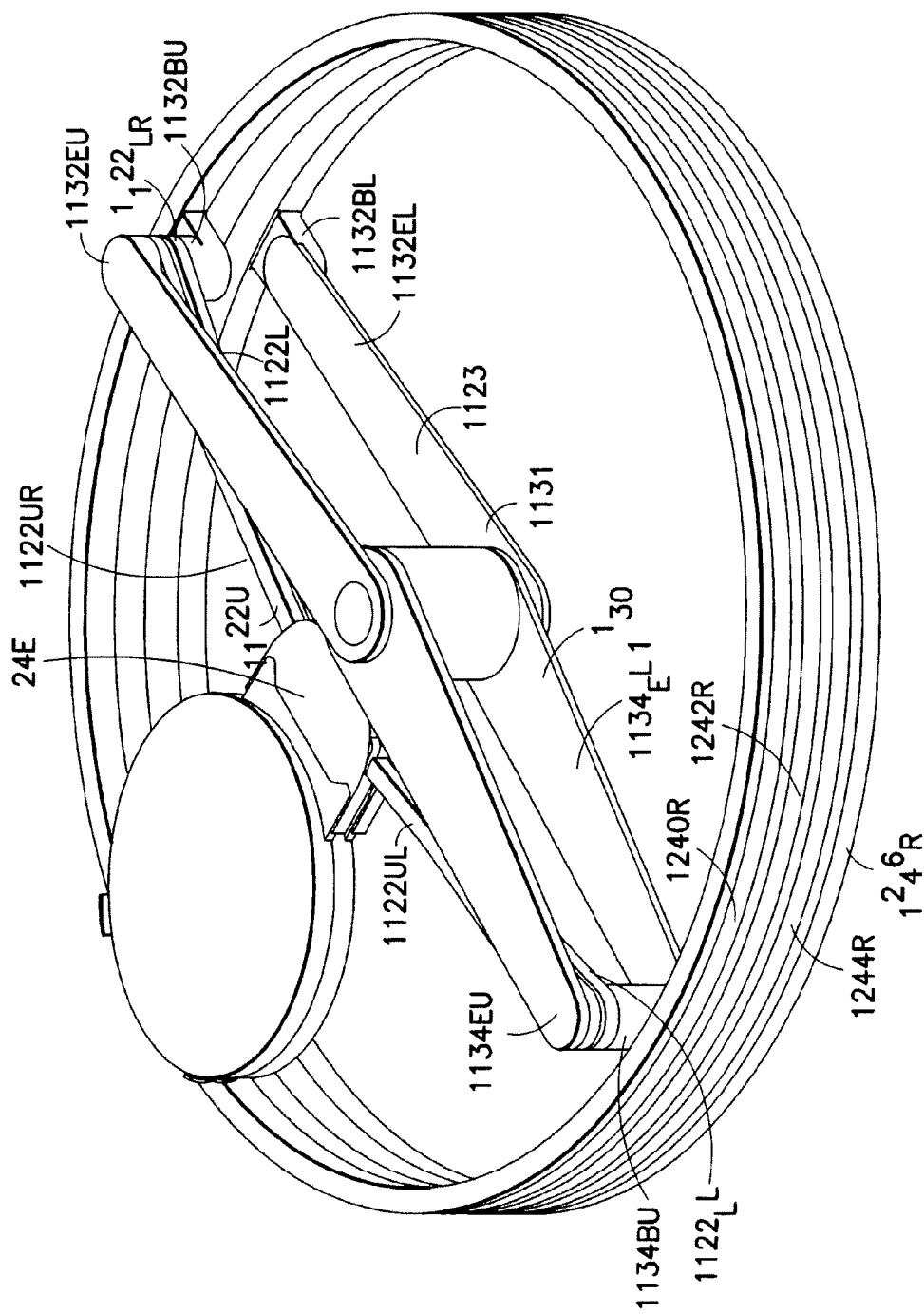

As seen best in FIGS. 13B and 14, the motors 1240, 1242, 1244, 1246 of the drive section 1228 are in a generally stacked configuration and are all located on one side of (e.g. under) the arm assemblies 1122U, 1122L. In the exemplary embodiment, arm assembly 1122U may be coupled to rotor hoops 1244R, 1246R by articulated bridge section 1123 as seen best in FIG. 13A. As can be seen in FIG. 13B the articulated bridge section 1123 includes a first bridge section 1131 and a second bridge section 1130. The first bridge section includes an upper base member extension 1132EU and lower base member extension 1132EL joined together by shaft 1131S. The second base member section 1130 includes an upper base member extension 1134EU and a lower base member extension 1134EL joined together by shaft 1130S. As can be seen in FIGS. 13A, 13B the bridge sections 1131, 1130 are pivotally joined to each other by their respective shaft sections 1131S, 1130S. In this example the shaft sections 1131S, 1130S are concentrically located such that shaft 1131S passes through or within shaft 1130S. The articulated bridge sections 1131, 1130 may be joined to each such that they are axially fixed (relative movement of the shafts) with respect to each other.

In this example, arm assembly 1122L may be coupled to rotor hoops 1240R, 1242R while arm assembly 1122U is coupled to rotor hoops 1244R, 1246R. For example, arm link 1122LR of arm 1122L may be pivotally coupled to a respective end effector 24E at one end and pivotally coupled to base member 1132BU of rotor 1240R at the other opposite end. The other arm link 1122LL of arm 1122L may be pivotally coupled to the respective end effector 24E at one end and pivotally coupled to base member 1134BU of rotor 1242R at the other opposite end. The arm link 1122UR of arm 1122U may be pivotally coupled to a respective end effector at one end and pivotally coupled at the other opposite end to the base member extension 1132EU of the bridge section 1123. The other arm link 1122UL of arm 1122U is pivotally coupled to the respective end effector at one end and pivotally coupled at the other end to the base member extension 1134EU of the bridge section 1130. In alternate embodiments, the arm assemblies may be connected to the rotor hoops in any other desired manner. In this example, the end effectors are extended and retracted above the rotor hoops but in alternate embodiments the transport arms can be configured so that the end effectors pass below the rotor hoops during extension and retraction.

Referring now to FIG. 14, stators 1240S, 1242S, 1244S, 1246S are provided and may be arranged in stator segments (six are shown for example purposes) similar to those described before (with respect to e.g. FIGS. 5 and 6) for driving their respective rotors 1240R, 1242R, 1244R, 1246R. The stators 1240S, 1242S, 1244S, 1246S may be substantially similar to each other and to those described above with respect to, for example, FIG. 10. As can be seen in FIG. 10 the stators may be housed in isolating casings 1414 in combination for example with sensors of the position feedback system in a manner substantially similar to that described above. As may be realized from FIG. 12C access slots 1414S may be formed into the lower surfaces of the peripheral chamber walls for installation of the respective stator casings 1414 in a manner substantially similar to that described above with respect to e.g. FIG. 7C.

Figure 15:
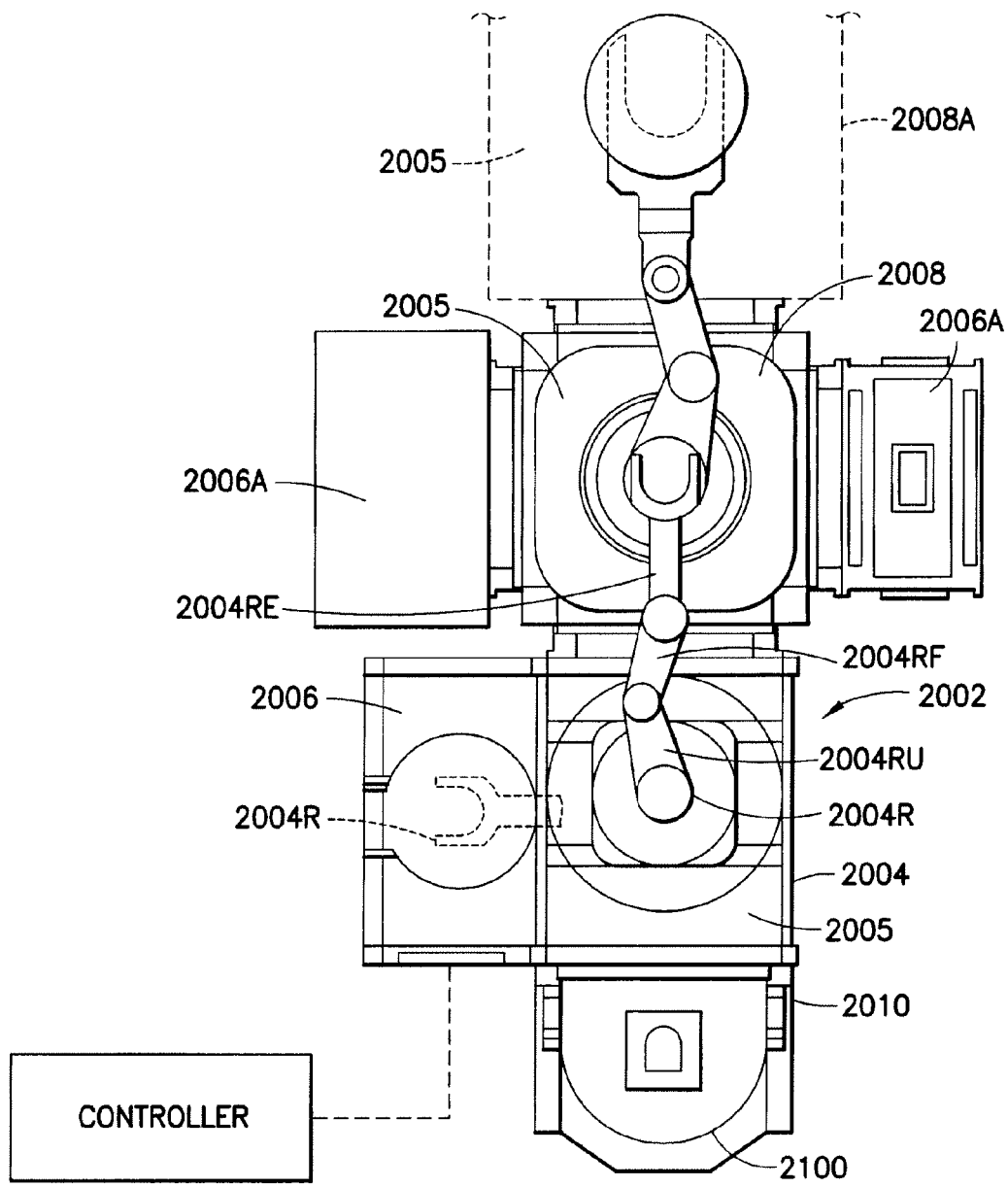
FIG. 15 is a schematic plan view of a substrate processing tool and carriers connected thereto in accordance with other exemplary embodiments.

Referring now to FIG. 15, another exemplary embodiment of a transport apparatus 2004R and a processing tool 2002 are shown. The tool 2002 may have processing modules 2006, 2006A, and front end module (FEM) 2004 with a desired controlled atmosphere (e.g. inert gas or very clean air). One or more of the process modules 2006 may be connected to the FEM so that the FEM transport robot 2004R may pick/place substrates in the process module. Process modules 2006, 2006A (though one process module is shown in alternate embodiments a stack of process modules may be joined to the FEM or to each of the one or more transfer modules) may share a common atmosphere with the FEM 2004. FEM 2004 may have a loading interface or load port, for loading and interfacing a carrier 2100 to the tool in an integral manner similar to that described previously. The FEM transport robot 2004R in the exemplary embodiment is shown as a SCARA robot that may pick/place substrates directly between carrier 2100 and one or more process module(s) 2006 through a clean tunnel substantially similar to that described in U.S. patent application Ser. No. 12/123,391 filed on May 19, 2008, the disclosure of which is incorporated herein by reference in its entirety. For exemplary purposes only the SCARA robot 2004R may have an upper arm 2004RU, a forearm 2004RF and an end effector 2004RE rotatably connected to each other in series and nested drive motors substantially similar to those shown above with respect to, for exemplary purposes only, FIGS. 4A and 13A. The upper arm 2004RU of the robot 2004R may be connected to or be integral with a bridge spanning one of the rotors of the nested drive. In one exemplary embodiment, the forearm 2004RF and end effector 2004RE may be slaved to the upper arm. In alternate embodiments the forearm 2004RF may be driven by one of the nested motors and the forearm 2004RE may be slaved accordingly so that as the arm extends the forearm 2004RE remains substantially longitudinally aligned with the path of extension. In still other alternate embodiments, the drive may have three nested motors such that each of the upper arm, forearm and end effector of the robot 2004R are individually driven by a respective motor any suitable transmission members connecting the robot arm links to a respective one of the nested motors. The robot 2004R may be configured with multiple arms, as described above with respect to FIGS. 4A and 13A so that the multiple arms provide multiple transport paths that are vertically stacked one above the other. The stacked transport paths allow substrates to be fed into and removed from processing modules and/or carrier or transported through the tunnel 2005 while passing over each other in the same or different directions of transport. The vertically stacked transport paths may run from transport module 2008 to transport module 2008A along the tunnel 2005 and/or from the transport modules to respective ones of the process modules 2006 and carrier(s) 2100.

In the exemplary embodiment shown in FIG. 15, the clean tunnel 2005 that is defined through the FEM interface 2010 into the carrier interior, and extends into the process modules 2006, 2006A may be varied in length or configuration (for example in a manner similar to U.S. application Ser. No. 11/422,511, filed May 26, 2006; U.S. application Ser. No. 10/624,987, filed Jul. 22, 2003; U.S. application Ser. No. 10/962,787, filed Oct. 9, 2004; U.S. application Ser. No. 11/442,509, filed May 26, 2006 and U.S. application Ser. No. 11/441,711, filed May 26, 2006 all incorporated by reference herein in their entirety). In the exemplary embodiment, transfer module(s) 2008 may be connected to the FEM, so that the FEM robot may pick/place substrates into the transfer module. The location of the transfer module(s) is merely exemplary. As may be realized, the clean tunnel may continue to extend from the FEM through the transfer module. More or fewer transfer module(s) 2008, 2008A may be connected to each other (for example serially, such as shown in phantom in FIG. 15) to vary the length and configuration of the clean tunnel as desired. Process modules (similar to modules 2006, 2006A) may be joined to the clean tunnel so that substrates may be transferred through the clean tunnel, for example to/from the carrier 2010 and any desired process module, or between any desired process modules. In the exemplary embodiment shown, the transfer module 2008 may have a transport robot inside the module, for example to transport substrates to/from process modules 2006A, or to an adjoining transfer module/chamber 2006A. In alternate embodiments, the transfer module may have no internal robot, the substrates being placed/picked there from by robots inside adjoining modules of the clean tunnel 2005. In still other exemplary embodiments, the transfer module may have any suitable length and include any suitable substrate transfer apparatus.

In the exemplary embodiment shown in FIG. 15, the transfer module(s) 2008, 2008A of the clean tunnel in tool 2002, may share the common controlled (e.g. inert gas, very clean air) of the FEM. In alternate embodiments, one or more of the transfer module(s) 2008, 2008A may be configured as a load lock so that portions of the clean tunnel may hold different atmospheres (for example the clean tunnel portion defined within the FEM may have a N2 environment, and the portion within the module 2008A may have a vacuum environment, transfer module 2008 may be a load lock capable of cycling substrates between the inert gas atmosphere in the FEM, and the vacuum atmosphere in module 2008A). As may be realized, in addition to being interfaceable with an FEM, the carrier may be interfaced directly with a vacuum portion of a process tool as described in U.S. patent application Ser. No. 12/123,391.

Figure 16:
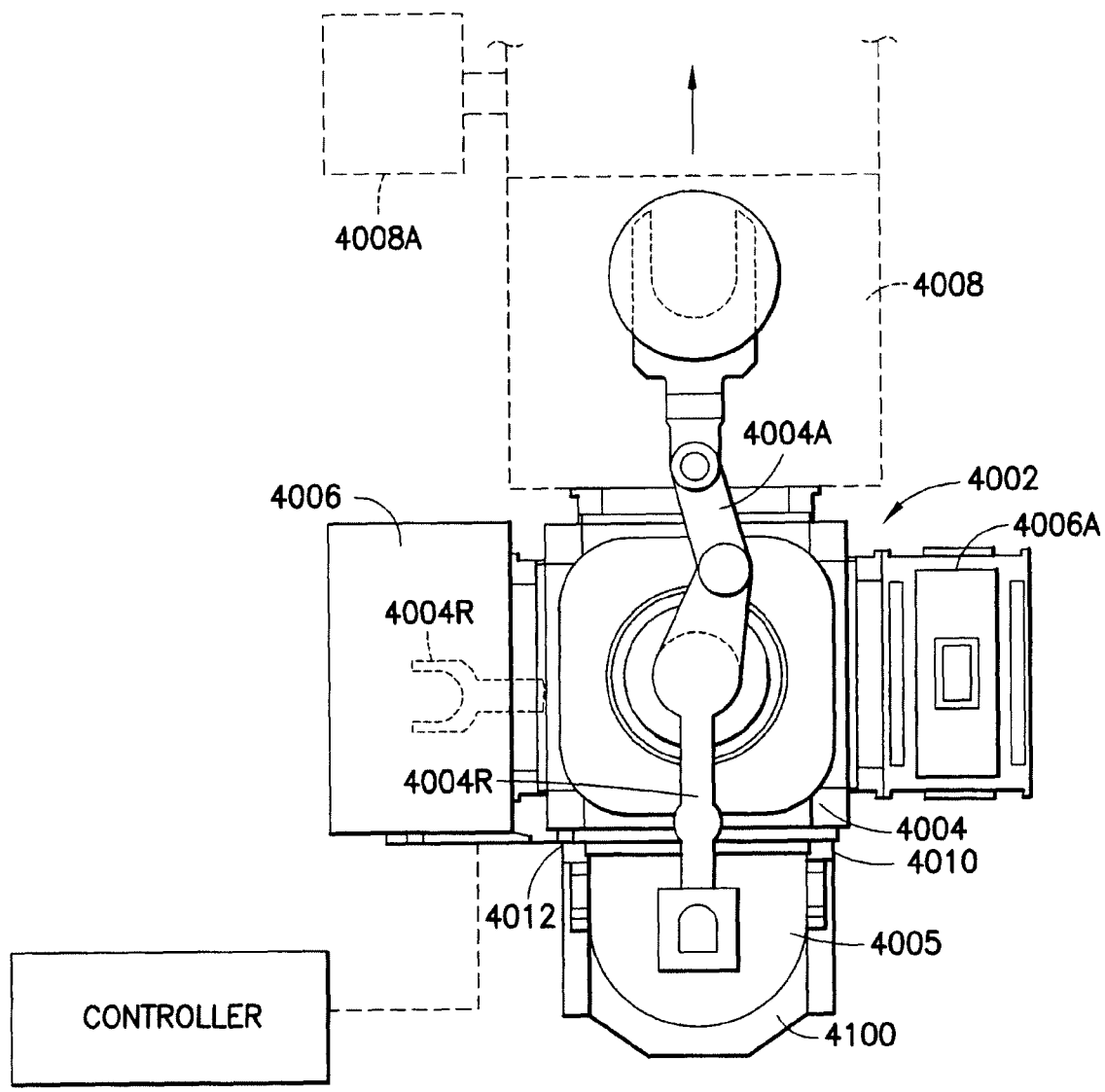
FIG. 16 is a schematic plan view of a substrate processing tool and carriers connected thereto in accordance with other exemplary embodiments.

Referring to FIG. 16, there is shown a plan view of another process tool 4002 in accordance with another exemplary embodiment. The tool 4002 in the exemplary embodiment shown in FIG. 16 may have processing modules 4006, 4006A, and FEM 4004 with for example a vacuum atmosphere (or in alternate embodiments inert gas or very clean dry air). One or more of the process modules 4006 (such as for example in vertically stacked or offset arrangement) may be connected to the vacuum FEM so that the vacuum transport robot 4004R may pick/place substrate in the process module as shown in FIG. 16 and similar to embodiment shown in FIG. 15. Process modules 4006, 4006a may share a common process vacuum with the loading section 4004. FEM 4004 may have a loading interface or load port, for loading and interfacing a carrier 4100 to the tool in an integral manner similar to that described previously. The vacuum transport robot 4004R in the exemplary embodiment may be substantially similar to that described above with respect to FIG. 15 and be configured to pick/place substrates directly between carrier 4100 and one or more process module(s) 4006,4006A through a clean tunnel similar to that described in U.S. patent application Ser. No. 12/123,391, previously incorporated by reference. In the exemplary embodiment shown in FIG. 16 the clean tunnel 4005 that is defined through the FEM interface 4010, 4012 into the carrier interior and extends into the process modules 4006, 4006A may be varied in length or configuration.

It should be understood that the exemplary embodiments described herein can be used individually or in any combination thereof. It should also be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A substrate transport apparatus comprising:
a peripheral wall having an inner surface that defines a substrate transport chamber capable of holding an isolated atmosphere;
at least one substantially ring shaped motor having at least one stator module located within the peripheral wall, between the inner surface and an adjacent outer surface of the peripheral wall and at least one rotor suspended substantially without contact within the transport chamber such that a surface of the peripheral wall encompassed by the ring shaped motor is configured for attachment thereto of a predetermined device; and
at least one substrate transport arm connected to the at least one rotor and having at least one end effector configured to hold at least one substrate.

2. The substrate transport apparatus of claim 1, wherein the at least one rotor is magnetically suspended substantially without contact within the transport chamber.

3. The substrate transport apparatus of claim 1, wherein the predetermined device is a fluid flow device configured to control a vacuum within the transport chamber.

4. The substrate transport apparatus of claim 3, wherein the substantially ring shaped motor surrounds the fluid flow device.

5. The substrate transport apparatus of claim 1, wherein the at least one stator module is located within a side or bottom of the peripheral wall.

6. The substrate transport apparatus of claim 1, wherein the fluid flow device comprises a vacuum system.

7. The substrate transport apparatus of claim 1, wherein the at least one substrate transport arm comprises two transport arms extendable in substantially opposite directions.

8. The substrate transport apparatus of claim 1, wherein the at least one substrate transport arm comprises two transport arms extendable in substantially the same direction.

9. The substrate transport apparatus of claim 1, wherein the at least one substrate transfer arm comprises two individually rotatable transport arms, each being rotatable about a center of rotation of a respective one of the at least one rotor.

10. The substrate transport apparatus of claim 1, wherein the at least one stator module is removably coupled to the peripheral wall.

11. The substrate transport apparatus of claim 1, further comprising a position feedback system comprising at least one sensor located within the at least one stator module and a sensor track located on the at least one rotor.

12. A substrate transport apparatus comprising:
a frame forming a chamber;
a plurality of stator module sets embedded at least partly into a peripheral wall of the chamber, each stator module set forming a part of a respective motor where each of the plurality of stator module sets is radially spaced apart from other different stator module sets in the plurality of stator module sets;
a plurality of rotors, each rotor being supported by a respective one of the stator module sets substantially without contact; and
at least one end effector connected to a respective one of the plurality of rotors, each of the at least one end effector being configured to support a substrate;
wherein each of the stator module sets and a respective rotor are configured to effect an extension and retraction of a respective one of the at least one end effector.

13. The substrate transport apparatus of claim 12, wherein each of the plurality of stator module sets and a respective one of the plurality of rotors forming a substantially ring shaped motor.

14. The substrate transport apparatus of claim 12, wherein the plurality of stator module sets are embedded at least partially into a side wall of the chamber.

15. The substrate transport apparatus of claim 12, wherein the plurality of stator module sets is embedded at least partially into a bottom wall of the chamber.

16. The substrate transport apparatus of claim 12, wherein each of the plurality of stator module sets comprises at least one winding set and a housing configured to isolate the at least one winding set from an atmosphere of the chamber.

17. The substrate transport apparatus of claim 16, wherein each of the at least one winding set is circumferentially spaced apart from other different ones of the at least one winding set.

18. The substrate transport apparatus of claim 12, further comprising at least one arm link rotatably connected at one end a respective one of the plurality of rotors and rotatably coupled at the other opposite end to the at least one end effector.

19. The substrate transport apparatus of claim 18, wherein the at least one arm link comprises an articulated bridge.

20. The substrate transport apparatus of claim 12, wherein the plurality of rotors comprises at least two rotors having a general stacked arrangement and the at least one end effector is configured to pass through a space between the at least two rotors.

21. The substrate transport apparatus of claim 12, wherein the plurality of rotors comprises at least two rotors having a general stacked arrangement and the at least one end effector is configured to pass above or below the at least two rotors.

22. The substrate transport apparatus of claim 12, wherein the plurality of rotors comprises at least two concentrically arranged rotors.

23. The substrate transport apparatus of claim 12, wherein the plurality of rotors and the plurality of stator module sets are configured such that a bottom of the frame and chamber are unobstructed.

24. The substrate transport apparatus of claim 12, further comprising a position feedback system, the position feedback system comprising at least one sensor located within the plurality of stator module sets and at least one sensor track located on the plurality of rotors.

25. A substrate processing apparatus comprising:
a frame having at least one isolatable chamber capable of holding a predetermined atmosphere;
a substrate transport located at least partly within the at least one isolatable chamber, the substrate transport being configured to transport at least one substrate, the substrate transport comprising,
at least two nested stator modules removably embedded into a peripheral wall of the at least one isolatable chamber;
at least two rotors located within the at least one isolatable chamber, each of the at least two rotors being supported by a respective one of the at least one stator substantially without contact forming at least two nested motors such that one of the at least two nested motors is surrounded by another different other one of the at least two nested motors; and
at least one transport arm coupled to the at least two rotors, the at least one transport arm having at least one end effector for supporting substrates;
wherein the at least two nested motors provide at least a two degree of freedom motion to the at least one transport arm.

26. The substrate processing apparatus of claim 25, further comprising a vacuum/vent system coupled to the at least one isolatable chamber through an unobstructed bottom of the at least one isolatable chamber.

27. The substrate processing apparatus of claim 25, wherein the at least two nested stator modules are configured to apply a torque and self bearing forces a respective rotor for effecting movement of the at least one transport arm.

28. The substrate processing apparatus of claim 25, wherein the at least one isolatable chamber comprises at least one opening on at least one side of the at least one isolatable chamber for inserting the at least one stator module into the peripheral wall.

29. The substrate processing apparatus of claim 25, wherein the at least one isolatable chamber comprises at least two isolatable chambers arranged in a serial configuration.

30. The substrate processing apparatus of claim 29, wherein one of the at least two isolatable chambers includes a symmetric substrate transport and the other one of the at least two isolatable chambers includes a bi-symmetric substrate transport.

31. A substrate transport apparatus comprising:
a frame forming a substrate transport chamber;
at least one motor comprising a set of stator modules circumferentially distributed onto a peripheral wall of the substrate transport chamber, each of the stator modules being independently mountable to the peripheral wall, the at least one motor further comprising at least one common ring rotor operating with each of the stator modules; and
at least one end effector connected to the at least one common ring rotor, each of the at least one end effector being configured to support a substrate;
wherein the set of stator modules and the at least one common ring rotor being configured to effect a motor motion of the at least one end effector in at least one degree of freedom.

* * * * *